(12) United States Patent
Unno

(10) Patent No.: US 7,202,495 B2
(45) Date of Patent: Apr. 10, 2007

(54) ORGANIC SEMICONDUCTOR ELEMENT, PRODUCTION METHOD THEREFOR AND ORGANIC SEMICONDUCTOR DEVICE

(75) Inventor: Akira Unno, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/517,529

(22) PCT Filed: Jun. 19, 2003

(86) PCT No.: PCT/JP03/07792

§ 371 (c)(1),
(2), (4) Date: Dec. 13, 2004

(87) PCT Pub. No.: WO04/001855

PCT Pub. Date: Dec. 31, 2003

(65) Prior Publication Data

US 2005/0247928 A1 Nov. 10, 2005

(30) Foreign Application Priority Data

Jun. 20, 2002 (JP) .............................. 2002-179468

(51) Int. Cl.
*H01L 51/00* (2006.01)
(52) U.S. Cl. .................... 257/40; 257/57; 257/643; 438/99
(58) Field of Classification Search .............. 257/57
See application file for complete search history.

(56) References Cited

U.S. PATENT DOCUMENTS

| | | | |
|---|---|---|---|
| 5,546,889 A | 8/1996 | Wakita et al. ............... 117/84 |
| 5,556,706 A | 9/1996 | Wakita et al. ............... 428/421 |
| 5,574,291 A | 11/1996 | Dodabalapur et al. ....... 257/40 |
| 5,596,208 A | 1/1997 | Dodabalapur et al. ....... 257/66 |
| 5,625,199 A | 4/1997 | Baumbach et al. .......... 257/40 |
| 6,326,640 B1 | 12/2001 | Shi et al. .................... 257/40 |
| 6,783,588 B2 | 8/2004 | Aoto et al. ................... 117/4 |
| 6,946,676 B2 * | 9/2005 | Kelley et al. ................ 257/40 |

FOREIGN PATENT DOCUMENTS

| | | |
|---|---|---|
| JP | 7-206599 | 8/1995 |
| JP | 9-232589 | 5/1997 |
| JP | 2001-94107 | 4/2001 |
| WO | 01/47045 | 6/2001 |

OTHER PUBLICATIONS

Jackson, T. et al. Organic Thin-Film Transistors for Organic Light-Emitting Flat-Panel Display Backplanes; 1998; IEEE Journal of Selected Topics in Quantum Electronics; vol. 4, No. 1, p. 100-104.*

(Continued)

*Primary Examiner*—Howard Weiss
*Assistant Examiner*—John Ingham
(74) *Attorney, Agent, or Firm*—Fitzpatrick, Cella, Harper & Scinto

(57) ABSTRACT

An organic semiconductor element is provided which has the controlled crystalline state of a vapor-deposited pentacene layer and a high mobility with low voltage driving. The organic semiconductor element is formed by providing a gate electrode 101 on the surface of a substrate 102, providing thereon a gate insulating layer 103, providing on the surface of the gate insulating layer 103 an island-shaped protrusion layer 104 having dispersed and island-shaped protrusions with a low surface energy, providing on the island-shaped protrusion layer 104 a source electrode 106 and a drain electrode 107 with a distance therebetween, providing thereon an organic semiconductor layer 105 in contact with the island-shaped protrusion layer 104 and both electrodes 106 and 107, and further providing a protective film 108 on the organic semiconductor layer 105.

5 Claims, 14 Drawing Sheets

OTHER PUBLICATIONS

Parikh, A. et al. An Intrinsic Relationship between Molecular Structure in Self-Assembled n-Alkylsiloxane Monolayers and Deposition Temperature; 1994; J. Phys. Chem. vol. 98, p. 7577-7590.*

Bao, Z. et al. High-Performance Plastic TRansistors Fabricated by Printing Techniques; 1997; Chem. Mater. vol. 9, p. 1299-1301.*

Sugimura, H. Micropatterning of Alkyl- and Fluoroalkylsilane Self-Assembled Monolayers Using Vacuum Ultraviolet Light; 2000, vol. 16, p. 885-888.*

English translation of JP 2001-094107 A; Hitachi (Apr. 6, 2001).*

Campbell, R. B, et al., "The Crystal and Molecular Structure of Pentacene", *Acta Cryst.*, vol. 14, (1961) pp. 705-711.

Lin, Y.-Y., et al. "Stacked Pentacene Layer Organic Thin-Film Transistors with Improved Characteristics", *IEEE Electron Device Letters*, vol. 18, No. 12, (Dec. 1997) pp. 606-608.

Lin, Y.-Y., "Pentacene-Based Organic Thin-film Transistors", *IEEE Transactions on Electron Devices*, vol. 44, No. 8, (Aug. 1997) pp. 1325-1331.

Klauk, et al., "Polymer Gate Dielectric Pentacene TFTs and Circuits on Flexible Substrates", Infineon Technologies, (Dec. 2002) pp. 557 to 560.

Brown, et al., "A universal relation between conductivity and field-effect mobility in doped amorphous organic semiconductors", Synthetic Metals, vol. 68, (1994) pp. 65-70.

Kitazaki, et al., "Extension of Fowkes' Equation and Estimation of Surface Tension of Polymer Solids" Adhesion Society of Japan, vol. 8, No. 3, (1972) pp. 131-142.

* cited by examiner

FIG. 12A

| 601 | 602 | 603 | 604 | 605 | 606 | 607 | 608 | 609 | 610 | 611 | 612 | 613 | 614 | 615 | 616 |
|---|---|---|---|---|---|---|---|---|---|---|---|---|---|---|---|

FIG. 12B

| 617 |
|---|
| 618 |

FIG. 12C

| 619 |
|---|
| 620 |
| 621 |
| 622 |

ORGANIC SEMICONDUCTOR ELEMENT, PRODUCTION METHOD THEREFOR AND ORGANIC SEMICONDUCTOR DEVICE

TECHNICAL FIELD

The present invention relates to an organic semiconductor element, the production method therefor, an active matrix type display device that utilizes the organic semiconductor element, and an organic semiconductor device that utilizes the organic semiconductor as an IC-card electronic tag.

BACKGROUND ART

Over the past decade, IC technology for use of an organic semicondutctor thin film transistor (organic TFT) has been proposed. The main attractive points of such circuitry come from the expectations for easy processing and adaptability to a flexible substrate. These advantages are expected to be utilized in the low cost IC technology to be appropriately applied to smart cards, electronic tags, displays and the like.

A general organic TFT is composed of a glass substrate, a gate electrode, a gate insulating film, a source electrode, a drain electrode and an organic semiconductor film. Variation of a voltage applied to the gate electrode (gate voltage: Vg) generates surplus or deficient charges at the interface between the gate insulating film and the organic semiconductor film so that the drain current (Id) flowing through the source electrode/organic semiconductor/drain electrode is varied to perform switching.

The physical quantities used for representing the performance of an organic TFT include mobility, on/off ratio and gate voltage threshold value. The mobility is proportional to the slope of the $\sqrt{Id}$-Vg curve in the saturation region where Id (drain current) and Vg (gate voltage) are in a linear relationship, and represents the degree of easiness in current flow. The on/off ratio is represented by the strength ratio between the minimal Id and maximal Id as obtained by varying Vg. The gate voltage threshold is defined by the X intercept of the straight line tangent to the $\sqrt{Id}$-Vg curve in the above-mentioned saturation region, and represents the gate voltage that causes switching.

The target values for the characteristics of an organic TFT are intended to attain those values for the a-Si TFT used in currently prevailing active matrix liquid crystal displays. More specifically, the target values include a mobility ranging from 0.3 to 1 $cm^2/Vs$, an on/off ratio of 106 or higher, and a gate voltage threshold value ranging from 1 to 2 V.

Recent advances in TFT devices based on polymers are described, for example, in U.S. Pat. No. 5,596,208, U.S. Pat. No. 5,625,199 and U.S. Pat. No. 5,574,291. According to the descriptions of these patents, development of n-type and p-type polymer materials comes to permit easy actualization of complementary IC, as detailed particularly in U.S. Pat. No. 5,625,199.

Besides, several attempts have been made for improving the characteristics of the field effect transistor.

Among others, the carrier mobility that is an important parameter determining the performance of the field effect transistor has been attempted to be improved by utilization of organic semiconductor materials with a sufficiently extended π-conjugated system, improvement of the crystallinity of the thin films of organic semiconductor materials, improvement of the characteristics as p-type semiconductor through enhancing the donor property on the basis of introduction of methyl groups into the organic semiconductors materials, utilization of organic semiconductor materials produced from oligomers having a single degree of polymerization rather than organic semiconductor materials having a dispersion in the degree of polymerization, and the like.

According to the recent studies, it has been revealed that the characteristics of the organic TFT are correlated with the crystallinity of the organic semiconductor film irrespective as to whether the organic semiconductor is of the lower molecule type or of the higher molecule type. For example, a paper (A. R. Brown, D. M. de Leeuw, E. E. Havinga, and A. Pomp, "Synthetic Metals," Vol. 68, pp. 65–70(1994)) has disclosed a finding that a high mobility and a high on/off ratio are not compatible with each other in an organic TFT that uses amorphous organic semiconductor film. Additionally, another paper (Y-Y. Lin, D. J. Gundlach, S. F. Nelson, and T. N. Jackson, "IEEE Transactions on Electron Devices," Vol. 44, No. 8, pp. 1325–1331 (1997)) has disclosed a production method of an organic TFT that uses as the semiconductor layer therein a high crystallinity vapor-deposited film of pentacene, and a finding that the TFT has such high characteristics that the mobility is 0.62 $cm^2/Vs$, the on/off ratio is 108 or more, and the gate threshold value is −18 V.

An attempt has been made to improve the crystallinity of the organic semiconductor film on the basis of an underlying layer that is provided beneath the organic semiconductor layer. Japanese Patent Application Laid-Open No. 7-206599 discloses a production method for oriented organic semiconductor films of oligothiophene compounds or the like by use of an oriented film of polytetrafluoroethylene (PTFE) as an underlying layer. In this case, the PTFE film is formed on the substrate surface by sliding a solid lump of PTFE under a certain pressure so that it is difficult to make the area of a substrate larger. Additionally, the molecules in the organic semiconductor layer are aligned uniformly along the orientation direction of the PTFE film so that the carrier conduction between the molecules becomes difficult to occur, and accordingly the expected characteristics are hardly obtained.

Additionally, Japanese Patent Application Laid-Open No. 9-232589 discloses a production method of an organic TFT that is provided with a film oriented so that the organic semiconductor layer is oriented along the direction connecting the source electrode and the drain electrode. In this case, the intermolecular conduction is also difficult to occur on the above-described grounds, and accordingly it is difficult to obtain the high characteristics.

Additionally, a paper (Y-Y. Lin, D. J. Gundlach, S. F. Nelson, and T. N. Jackson, "IEEE Electron Devices Letters," Vol. 18, No. 12, pp. 606–608 (1997)) discloses a production of a high performance organic TFT by forming two deposited layers of pentacene on the surface of the gate insulating film coated with octadecyltrisilane that is a type of perpendicularly oriented film. In this case, the evaluation of the TFT characteristics uses the drain voltage of −80 V and the gate voltage of −100 V, which are too high as the voltages to be applied to a semiconductor element.

Additionally, Japanese Patent Laid-Open Application No. 2001-94107 discloses an organic semiconductor device in which a crystalline organic semiconductor layer is formed on a fluorine-based polymer layer of 0.3 to 10 nm in thickness formed by the dip method on the surface of the gate insulating layer. However, with such a scheme of production, an interface is formed between the gate insulating film and the fluorine-based polymer layer so that no high mobility can be expected, and the driving voltage should become large according to the described configuration. Furthermore, the crystalline layer in the organic semiconductor layer exhibits two peaks so that the orientation thereof is not satisfactory, and hence no large improvement in characteristics can be expected. Additionally, Japanese Patent Laid-Open Application No. 2001-94107 describes that the mobility is increased by the presence of the two different crystal axes which are borne by the pentacene. It is conceivable that this is an invention based on a mechanism essentially different from that of the present invention because according to the present invention the mobility of the transistor is increased with increasing C-axis orientation ratio.

For the purpose of improving the characteristics of the organic TFT, important are the improvement of the crystallinity of the organic semiconductor film, the improvement of the design for element constitution, and furthermore the provision of high performance to the insulating film, and the like.

The present invention has been made for the purpose of overcoming the above-described problems, and an object of the present invention is to provide an organic semiconductor element that can be made uniformly on a large area of a substrate, can largely modulate the drain current through the voltage applied to the gate electrode, and has a high mobility.

Furthermore, another object of the present invention is to provide an organic semiconductor element that is stable in operation, can be driven by a low voltage, is long in operating life, and can be produced by a simple and easy method.

Additionally, still another object of the present invention is to provide an active matrix type display device that utilizes the above-described organic semiconductor element or an organic semiconductor device that utilizes the organic semiconductor element as IC-card electronic tag.

DISCLOSURE OF INVENTION

More specifically, a first invention of the present invention is an organic semiconductor element comprising a gate electrode, a gate insulating layer, an organic semiconductor layer, source/drain electrodes and a protective film, which are provided on the surface of a substrate, wherein an island-shaped protrusion layer having dispersed and island-shaped protrusions with a low surface energy is provided in contact with the above-described organic semiconductor layer.

It is preferable that between the above-described gate insulating layer and organic semiconductor layer is provided an island-shaped protrusion layer having dispersed and island-shaped protrusions with a low surface energy.

It is preferable that the surface energy of the above-described island-shaped protrusions is 30 dyn/cm$^2$ or less.

It is preferable that the proportion of the island-shaped protrusions dispersed in the above-described island-shaped protrusion layer in relation to the whole island-shaped protrusion layer is 10 to 95%.

It is preferable that each height of the above-described protrusions is 0.2 to 150 nm.

It is preferable that the average diameter of the above-described protrusions is 0.1 to 100 nm.

It is preferable that the above-described island-shaped protrusions with the low surface energy are formed of polyamide or polyimide.

It is preferable that the above-described island-shaped protrusions with the low surface energy are made of a fluorine-based polymer selected from the group consisting of polyfumarate-based polymers and cyclic perfluoropolymers.

It is preferable that the above-described island-shaped protrusions with the low surface energy are made of a fluorine-based compound selected form the group consisting of fluoroalkylsilane compounds and perfluoroether-based compounds.

It is preferable that the above-described organic semiconductor layer is formed of pentacene or tetracene.

It is preferable that the above-described organic semiconductor layer has periodicity with respect to the surface normal direction of the above-described gate insulating layer.

It is preferable that the above-described organic semiconductor layer is made of a film of a pentacene derivative and the C-axis orientation ratio of the film of the pentacene derivative is 85% or more.

A second invention of the present invention is a production method of an organic semiconductor element, comprising providing, on the surface of a substrate, a gate electrode, a gate insulating layer, an organic semiconductor layer, source/drain electrodes and a protective film, wherein an island-shaped protrusion layer having dispersed and island-shaped protrusions with a low surface energy is formed in contact with the organic semiconductor layer by forming the island-shaped protrusions in a dispersed manner by spin coating or spray coating.

It is preferable that after the island-shaped protrusion layer having the dispersed and island-shaped protrusions has been formed by the above-described spin coating or spray coating, the organic semiconductor layer is formed on the island-shaped protrusion layer under the heating condition of 60° C. to 200° C.

A third invention of the present invention is an active matrix type display device utilizing the above-described organic semiconductor element as an active element.

A fourth invention of the present invention is an organic semiconductor device utilizing the above-described organic semiconductor element as an IC information electronic tag.

BRIEF DESCRIPTION OF DRAWINGS

FIGS. 12A, 12B and 12C are the diagrams illustrating the production processes of an active matrix liquid crystal display device;

BEST MODE FOR CARRYING OUT THE INVENTION

Figure 1:
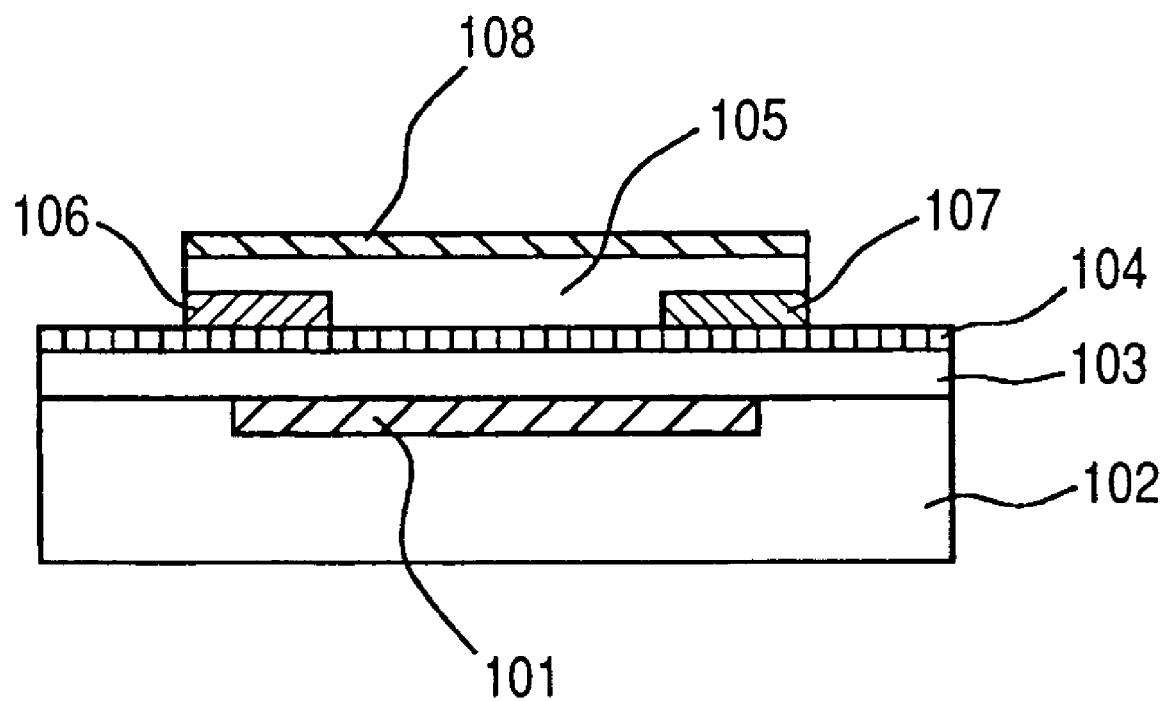
FIG. 1 is a schematic sectional view showing an embodiment of an organic semiconductor element of the present invention.

Detailed description is made below on the present invention.

An organic semiconductor element of the present invention comprises, on a substrate, a gate electrode, a gate insulating layer, an organic semiconductor layer, source/drain electrodes, and an protective film, and an island-shaped protrusion layer in which island-shaped protrusions with a low surface energy are formed in a dispersed manner in contact with the above-described organic semiconductor layer.

A general organic semiconductor is composed of a gate electrode, a gate insulating electrode, a source electrode and a drain electrode arranged at a horizontal distance therebetween, and an organic semiconductor layer, all formed on a substrate, and operates either in an accumulation condition or in a depletion condition. The configuration of a general semiconductor element includes an inversely staggered configuration in which a gate electrode, a gate insulating layer, a source electrode and a drain electrode, and a protective film are formed on a substrate according to the order of citation and a coplanar configuration in which a gate electrode, a gate insulating layer, a source electrode and a drain electrode, an organic semiconductor layer, and a protective film are formed on a substrate in the mentioned order; and a configuration is used in which the organic semiconductor layer is interposed between the source electrode and the drain electrode.

Besides, as for the above-described configurations of a general organic semiconductor element, the organic semiconductor element of the present invention is characterized in that the element has an island-shaped protrusion layer in which island-shaped protrusions with a low surface energy are formed in a dispersed manner and the island-shaped protrusion layer is arranged at a position in contact with the organic semiconductor layer.

The preferred embodiments of the configuration of the organic semiconductor element of the present invention that has an island-shaped protrusion layer are as follows.

(1) An organic semiconductor element in which a gate electrode, a gate insulating layer, an island-shaped protrusion layer in which island-shaped protrusions with a low surface energy are formed in a dispersed manner, an organic semiconductor layer, source/drain electrodes, and a protective film are formed on the surface of a substrate in the mentioned order.

(2) An organic semiconductor element in which a gate electrode, a gate insulating layer, an organic semiconductor layer, an island-shaped protrusion layer in which island-shaped protrusions with a low surface energy are formed in a dispersed manner, source/drain electrodes, and a protective film are formed on the surface of a substrate in the order of citation.

(3) An organic semiconductor element in which a gate electrode, a gate insulating layer, source/drain electrodes, an island-shaped protrusion layer in which island-shaped protrusions with a low surface energy are formed in a dispersed manner, an organic semiconductor layer, and a protective film are formed on the surface of a substrate in the mentioned order.

(4) An organic semiconductor element in which a gate electrode, a gate insulating layer, any one of source/drain electrodes, an island-shaped protrusion layer in which island-shaped protrusions with a low surface energy are formed in a dispersed manner, an organic semiconductor layer, the other of the source/drain electrodes, and a protective film are formed on the surface of a substrate in the mentioned order.

In the configurations of the organic semiconductor element of the present invention as shown in the above-described embodiments, it is preferable that between the gate insulating layer and the organic semiconductor layer is provided the island-shaped protrusion layer in which island-shaped protrusions with the low surface energy are formed in a dispersed manner.

In the next place, specific description is made on the organic semiconductor element of the present invention.

FIG. 1 is a schematic sectional view showing an embodiment of an organic semiconductor element of the present invention.

In FIG. 1, reference numeral 101 denotes a gate electrode; 102, a substrate; 103, a gate insulating layer; 104, an island-shaped protrusion layer; 105, an organic semiconductor layer; 106, a source electrode; 107, a drain electrode; and 108, a protective film.

In FIG. 1, in an configuration example of an organic semiconductor element of the present invention, the gate electrode 101 is provided on the surface of the substrate 102, the gate insulating layer 103 is provided thereon, on the surface of the gate insulating layer 103 is provided the island-shaped protrusion layer 104 in which island-shaped protrusions with a low surface energy are formed in a dispersed manner, on the island-shaped protrusion layer 104 are provided the source electrode 106 and the drain electrode 107 at a distance therebetween, the organic semiconductor layer 105 is provided thereon in contact with the island-shaped protrusion layer 104 and both electrodes 106 and 107, and furthermore on the organic semiconductor 105 is provided the protective film 108.

As for the substrate 102 in the present invention, the material thereof can be selected from a wide range of materials as far as the materials are insulating materials. Specifically, there can be used glass, inorganic materials including alumina sintered body and the like, and various types of insulating plastics and the like including polyimide film, polyester film, polyethylene film, polyphenylene sulfide film, polyparaxylene film and the like. Particularly, the use of plastic substrates is significant, which makes it possible to produce flexible organic semiconductor elements light in weight.

For the gate insulating layer 103 in the present invention, used are the organic materials including polychloropyrene, poly(ethylene terephthalate), poly(oxymethylene), poly(vinyl chloride), poly(vinylidene fluoride), cyanoethyl pullulan, poly(methyl methacrylate), polysulfone, polycarbonate, polyimide and the like; these organic materials may be used to form the layer by the coating method. Additionally, there can be used the inorganic materials including $SiO_2$, $SiN_x$, $Al_2O_3$, $Ta_2O_5$ and the like. These inorganic materials can be used to form the layer by the conventional pattern process including the mask vapor deposition and the like. Additionally, it is preferable to use as the gate insulating layer, the fluorine polymer that is used as the material for the island-shaped protrusion layer described later. Needless to say, the material for the gate insulating layer 103 is not limited to the above-described materials, and any combination of two or more of these materials can be used.

Furthermore, the metal of the gate electrode can be oxidized to form an insulating film to be used as the gate insulating layer.

The island-shaped protrusion layer 104 of the present invention is formed so that island-shaped protrusions with a low surface energy are formed in a dispersed manner. The surface energy of the island-shaped protrusions is 30 dyn/$cm^2$ or less, preferably 28 dyn/$cm^2$ or less, more preferably falls in the range from 26 to 3 dyn/$cm^2$. The surface energy exceeding 30 dyn/$cm^2$ is unpreferable because the perpendicular molecular orientation is degraded. Incidentally, the surface energy defined in the present invention means the surface energy of the continuous film formed with the material used for constituting the island-shaped protrusions.

Additionally, it is desirable that the proportion of the island-shaped protrusions dispersed in the above-described island-shaped protrusion layer falls in the range from 10 to 95% of the whole layer, preferably from 20 to 80%. Unpreferably, the proportion less than 10% degrades the perpendicular orientation, and the proportion exceeding 95% causes charge trapping in the insulating layer, which leads to degradation of the electric characteristics.

Additionally, it is desirable that each height of the above-described island-shaped protrusions falls in the range from 0.2 to 150 nm, preferably from 0.4 to 120 nm.

Additionally, it is desirable that the average diameter of the above-described island-shaped protrusions falls in the range from 0.1 to 100 nm, preferably from 0.15 to 80 nm.

Figure 2:
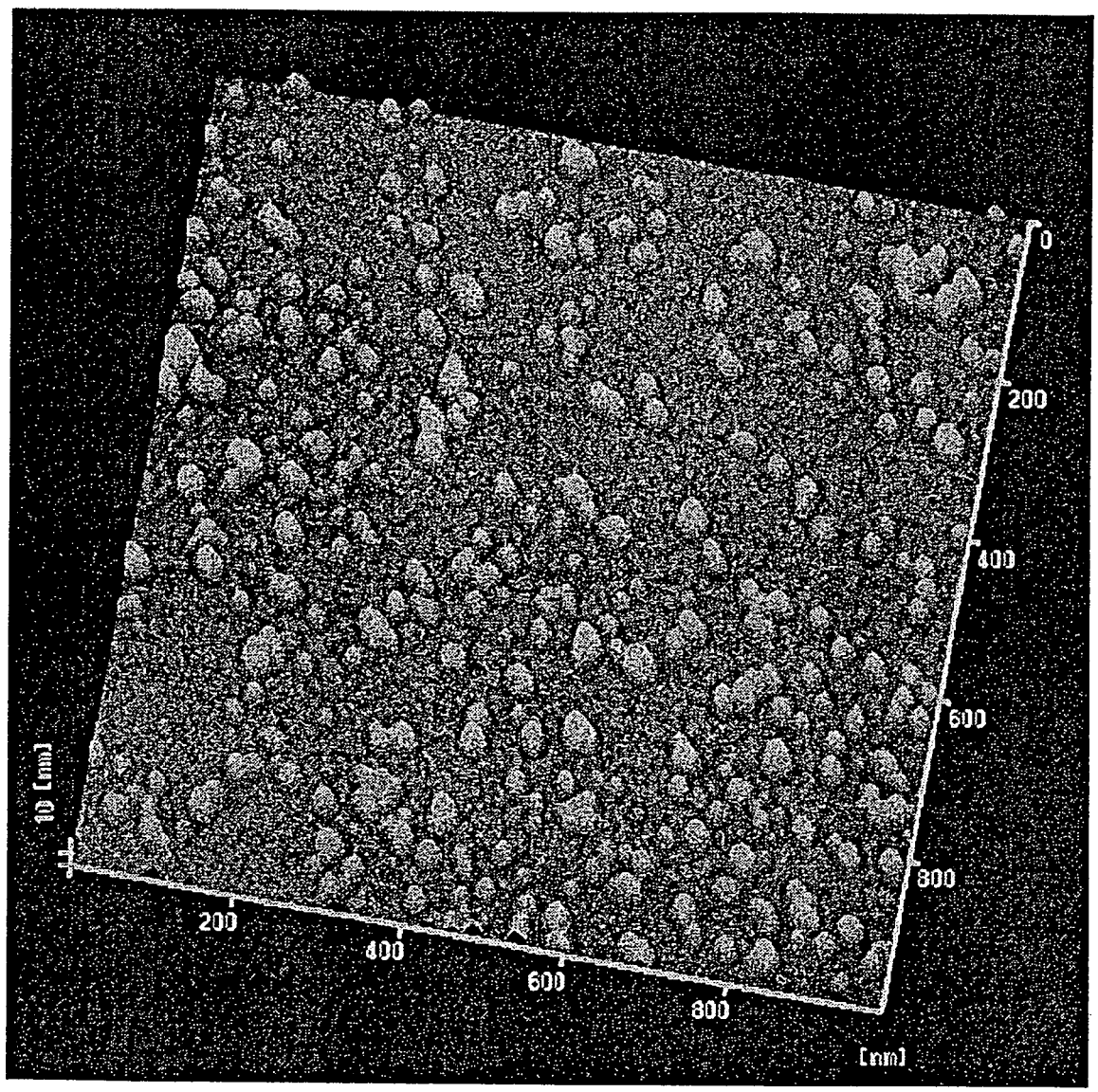
FIG. 2 is an AMF type electron microscopic photograph (magnification: ×100,000) displaying the fine patterns of island-shaped protrusions formed on a gate insulating layer situated on a substrate.
Figure 3A:
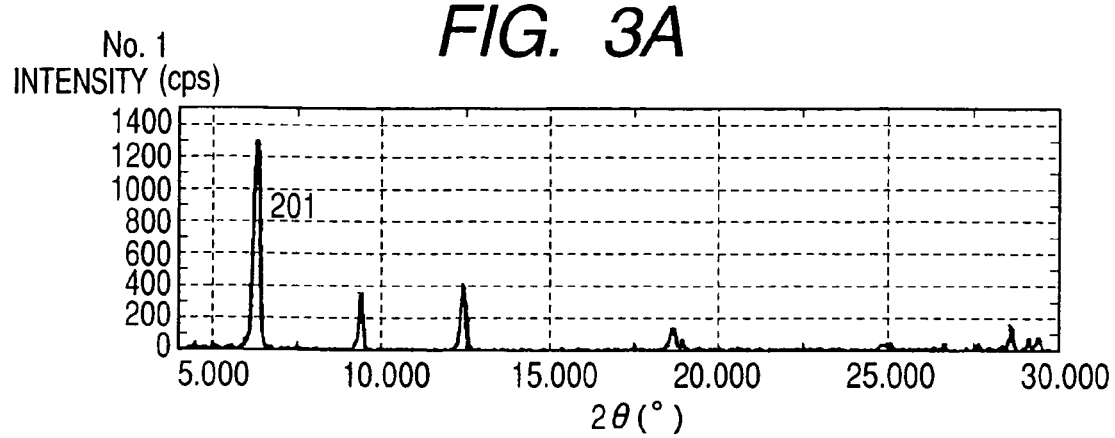
FIGS. 3A, 3B, 3C and 3D are the charts showing the X-ray diffractions of vapor-deposited pentacene films.
Figure 3B:
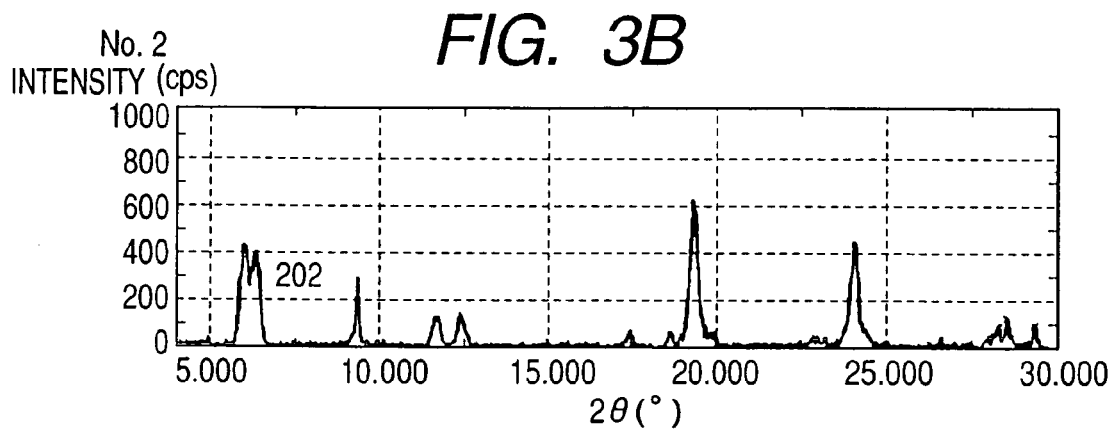
Figure 3C:
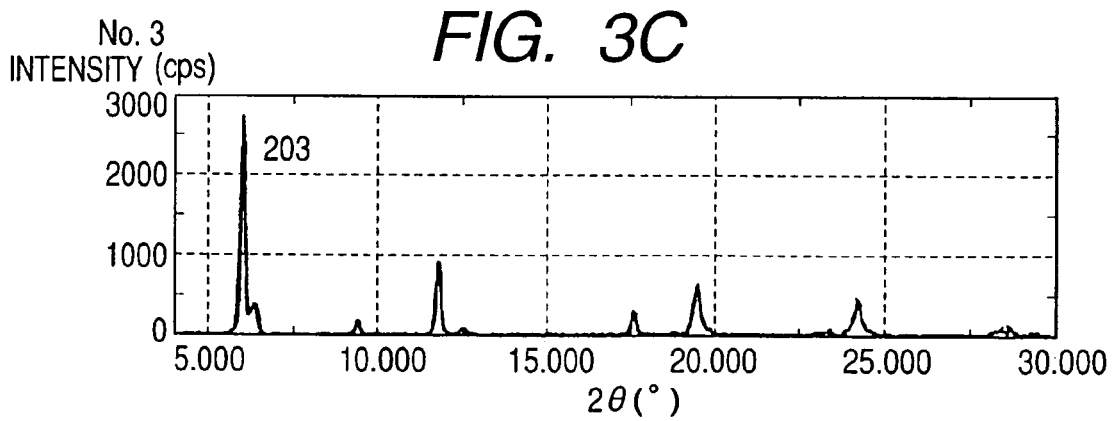
Figure 3D:
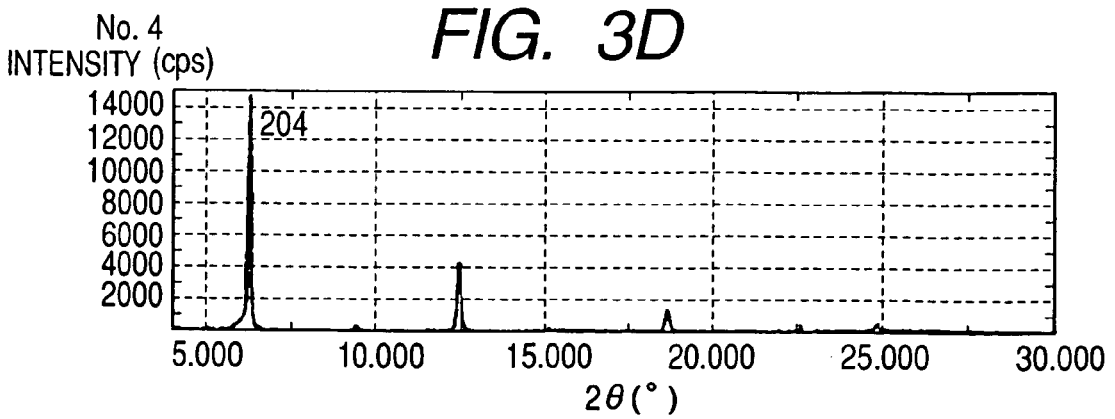

FIG. 2 shows an AMF type electron microscopic photograph (magnification: ×100,000) displaying the fine patterns of island-shaped protrusions formed on a $SiO_2$ film substrate that is composed of a gate insulating layer formed of $SiO_2$ film on a substrate. The protrusions in FIG. 2 show the island-shaped protrusions; each of many island-shaped protrusions comprises a single protrusion, and some island-shaped protrusions comprise two or more of protrusions in contact with each other. FIG. 2 shows the island-shaped protrusions formed of a fluorine polymer in Example 1 to be described later; the plane layer on which the island-shaped protrusions are dispersed represents the island-shaped protrusion layer.

It is preferable that the above-described island-shaped protrusions with a low surface energy are formed of a material having a highly linear chemical structure such as polyamide, polyimide, or the like.

Specific preferable examples of polyamide are, for example, the polyamides comprising the condensation polymerization products obtained from the dicarboxylic acids represented by the following structural formulas (1) to (3) and the diamines represented by the following structural formulas (11) to (13).

(1)

-continued

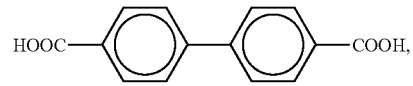
(2)

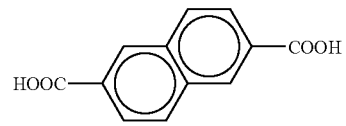
(3)

(11)

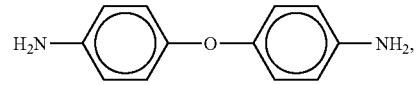
(12)

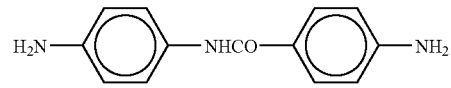
(13)

Additionally, specific preferable examples of polyimide are, for example, the polyimides comprising the condensation polymerization products obtained from the tetracarboxylic acid dianhydrides represented by the following structural formulas (4) to (7) and the diamines represented by the above-described structural formulas (11) to (13).

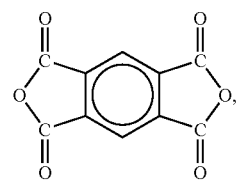
(4)

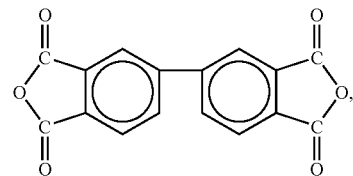
(5)

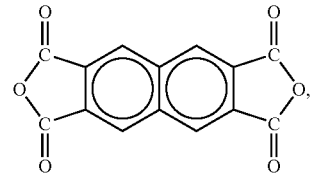
(6)

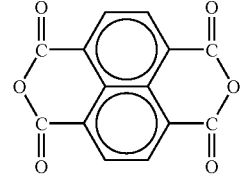
(7)

Furthermore, it is preferable that the above-described island-shaped protrusions with a low surface energy are formed of a material comprising a fluorine-based polymer selected from the group consisting of polyfumarate-based polymers and cyclic perfluoropolymers, or a material comprising a fluorine-based compound selected from the group consisting of fluoroalkylsilane compounds and perfluoroether-based compounds.

The polyfumarate-based polymers include, for example, the polymers represented by the following structural formula (8):

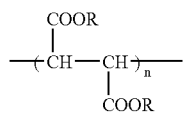

where R is —$(CH_2)_L(CF_2)_mCF_3$, L≧0 and m≧0.

The fluoroalkylsilane compounds include, for example, the compounds represented by the following structural formula (9):

$$CF_3(CF_2)_a(CH_2)_bSi(OMe)_3 \quad (9)$$

where Me is $CH_3$, a≧0 and b≧0.

The perfluoroether-based compounds include, for example, the compounds represented by the following structural formulas (10) through (18):

$$F(CF_2CF_2CF_2-O)_mC_2F_4-COOH \quad (10)$$

$$OHCO(CF_2CF_2O)_m(CF_2)_n-COOH \quad (11)$$

$$HO-CH_2-(CF_2CF_2O)_m(CF_2O)_n-CH_2-OH \quad (12)$$

$$F(CF_2CF_2CF_2-O)_nC_2F_4-CH_2-OH \quad (13)$$

$$F(CF_2CF_2CF_2-O)_nC_2F_4-COONH_3-O- \quad (14)$$

$$-O-H_3N-OCO-(CF_2CF_2O)_m-(CF_2O)_n-COONH_3-O- \quad (15)$$

$$F(CF_2CF_2CF_2-O)_nC_2F_4-COONH_4 \quad (16)$$

$$H_4N-OCO-(CF_2CF_2O)_m-(CF_2O)_n-COONH_4 \quad (17)$$

$$H_2C-CH_2-O-(CF_2CF_2O)_m-(CF_2O)_n-O-CH_2 \quad (18)$$

Needless to say, the fluorine-based polymers or fluorine-based compounds used as the materials for the island-shaped protrusions with a low surface energy in the present invention are not limited to the above-described materials.

The gate electrode 101 in the present invention can be formed by using as the material thereof organic materials including polyaniline and polythiopohene, or conductive inks, by utilizing the coating method that is easy in process of electrode formation. Additionally, the gate electrode formation utilizes metals such as gold, platinum, chromium, palladium, aluminum, indium, molybdenum, and nickel; alloys of these metals; and inorganic materials such as polysilicon, amorphous silicon, tin oxide, indium oxide, and indium tin oxide (ITO); these inorganic materials can be used to form the electrode by using the conventional photolithography method. Needless to say, the materials for the gate electrode formation are not limited to the above-described materials, and any combination of two or more of the above-described materials can be utilized.

It is desirable that the materials for the source electrode 106 and drain electrode 107 in the present invention are formed of a metal with a large work function because most organic semiconductors are of the p-type semiconductor having holes as the carriers transporting charges in order to form an ohmic contact with the semiconductor layer. Specifically, such metal includes gold and platinum, but are not limited these materials. Here, the work function means a potential difference needed to extract an electron from a solid, which is defined as a value obtained from an energy difference between the vacuum level and Fermi level divided by a charge quantity. Additionally, in the case of doping with a dopant at a high density to the surface of a semiconductor layer, it becomes possible to cause carrier tunneling through the metal/semiconductor interface and thus the carrier behavior becomes independent of the kind of the metal material; thus, the metallic or organic conductive materials listed for the gate electrode can also be included in the materials concerned.

It is desirable that the organic semiconductor layer 105 in the present invention is formed of a material selected from the group consisting of π-electron conjugated systems based aromatic compounds, chain compounds, organic pigments, organic silicon compounds, and the like. Specific materials include pentacene, pentacene derivatives with a bicyclo ring introduced between the central benzene rings, tetracene, anthracene, thiophene oligomer derivatives, phenylene derivatives, phthalocyanine compounds, polyacetylene derivatives, polythiophene derivatives, and cyanine dyes; however, the material concerned is not limited to these materials. The structural formulas for pentacene (formula 19) and tetracene (formula 20) are shown below:

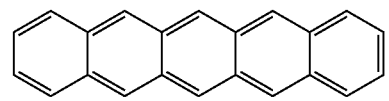

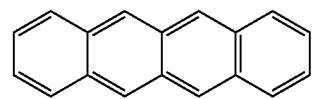

The present invention is characterized in that an island-shaped protrusion layer having island-shaped protrusions with a low surface energy is provided in contact with an organic semiconductor layer, wherein the protrusions are formed in a dispersed manner. In the case of forming the organic semiconductor layer on the island-shaped protrusion layer made of, for example, a pentacene derivative film, a C-axis orientation ratio of the pentacene derivative film becomes 85% or more, preferably 90% or more, thus enabling the orientation of the pentacene derivative film to be increased.

Additionally, it is preferable that the island-shaped protrusion layer is arranged between the gate insulating layer and the organic semiconductor layer; it is also possible to form the island-shaped protrusion layer so that the organic semiconductor layer may have a periodicity with respect to the surface normal direction of the above-described gate insulating layer. Here the periodicity means a successive stacking of a single layer composed of pentacene molecules.

In the next place, description is made on the production method of the organic semiconductor element of the present invention.

The production method of organic semiconductor element of the present invention is a method in which a gate electrode, a gate insulating layer, an organic semiconductor layer, source/drain electrodes, and a protective film are formed on the surface of a substrate, and is characterized in that an island-shaped protrusion layer is formed on which island-shaped protrusions with a low surface energy are formed in a dispersed manner by spin coating or spray coating.

In the present invention, as described above, a gate electrode, a gate insulating layer, an organic semiconductor layer, source/drain electrodes, and a protective electrode are formed on the surface of a substrate; the formation of the above-described electrodes and layers other than the island-shaped protrusion layer can be carried out by a conventional method.

Specifically, the production methods of the above-described electrodes and layers include the plasma CVD method to be applied to inorganic insulating films and the like and the sputtering method to be applied to a metal, tin oxide, indium oxide, ITO films and the like. Additionally, for pattern processing, the conventional photolithography method and dry etching method or wet etching method are used. Additionally, the production methods of thin films made of conductive organic materials, conductive inks, insulating organic materials, and semiconductor organic materials include the spin coating method, cast method, pulling method, vacuum vapor deposition method, and ink jet method.

The production method of organic semiconductor element of the present invention is characterized in that the island-shaped protrusion layer is provided in contact with the organic semiconductor layer in which island-shaped protrusions with a low surface energy are formed in a dispersed manner.

Figure 4:
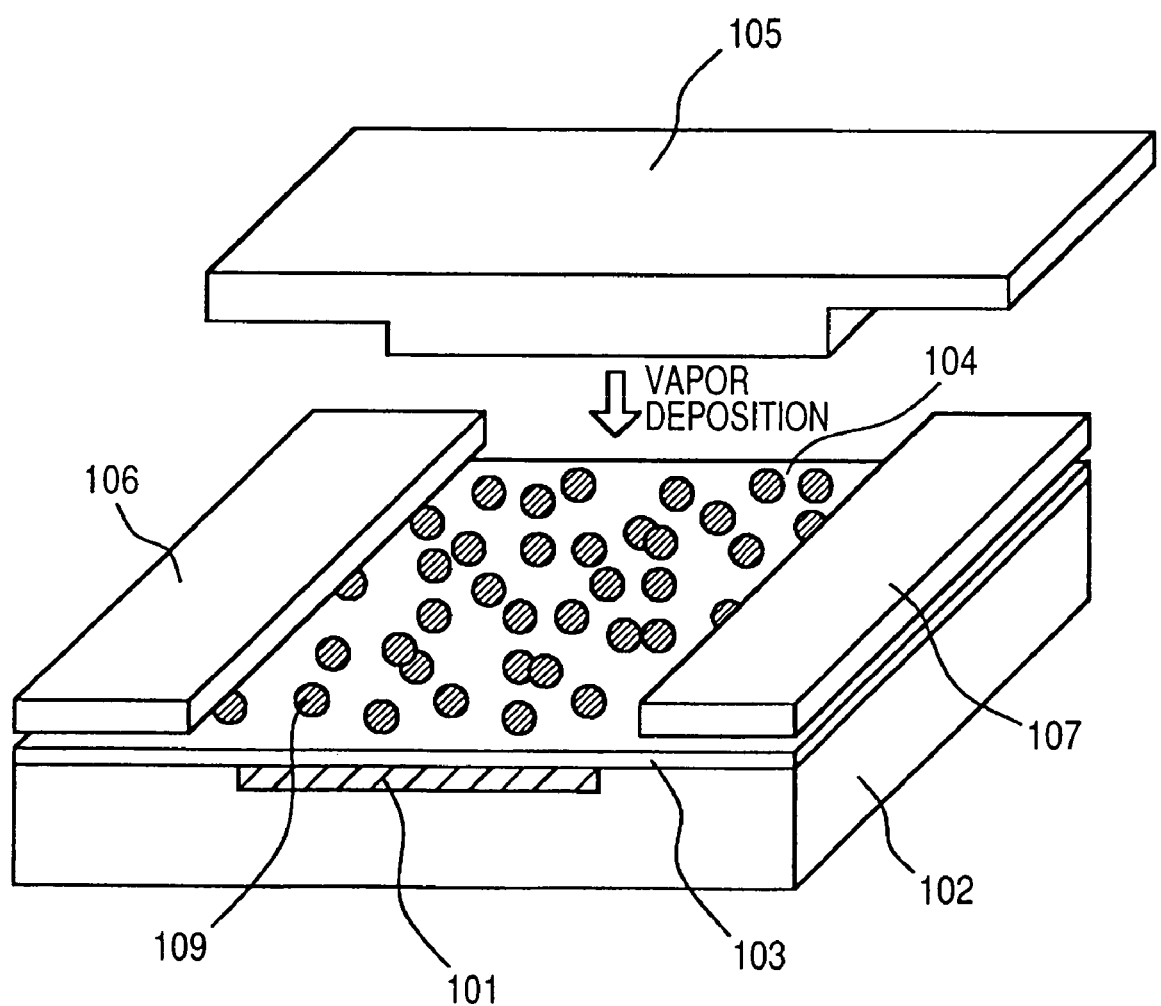
FIG. 4 is a schematic diagram showing an embodiment of a production method of an organic semiconductor element of the present invention.

FIG. 4 is a schematic diagram showing an embodiment of a production method of an organic semiconductor of the present invention. In FIG. 4, according to the production method of organic semiconductor of the present invention, a gate electrode 101 and a gate insulating layer 103 are formed on the surface of a substrate 102, and subsequently an island-shaped protrusion layer 104 on the gate insulating layer 103 by spin coating or spray coating. The island-shaped protrusion layer 104 is composed of a layer having a surface on which island-shaped protrusions 109 with a low surface energy are formed in a dispersed manner. Then, a source electrode 106 and a drain electrode 107 are formed on the island-shaped protrusion layer 104, and subsequently an organic semiconductor layer 105 is formed in a film by vapor deposition. The organic semiconductor layer 105 covers the surface of the island-shaped protrusions 109 and is also infilled between the island-shaped protrusions 109. Furthermore, a protective film is formed thereon.

It is desirable that the production method of an island-shaped protrusion layer of the present invention on which island-shaped protrusions with a low surface energy are dispersed includes the spin coating or spray coating method as described above. For example, it is desirable that the spin coating method produces the layer as follows: a solution is prepared in which the above-described fluorine polymer is dissolved in a fluorine-based solvent at a predetermined temperature, and coating is conducted with this solution by maintaining 50 revolutions for 10 sec and subsequently by maintaining 1,500 revolutions for 30 sec. The spray coating method is conducted using the air spray system or airless system, and it is preferable that the fine particle size under the atomized conditions is as small as possible. In general, the film thickness tends to be thinner as the solution concentration and the number of revolutions become lower; because even under the same coating conditions, the feature of the film is significantly varied depending on the adsorbability and molecular weight of the fluorine-based polymer, the coating may be appropriately conducted under the optimal coating conditions.

In the present invention, the use of the above-described spin coating or spray coating method permits the formation of the island-shaped protrusion layer with island-shaped protrusions in a dispersed state. The cause for formation of the island-shaped protrusions in a dispersed state probably involves the number of revolutions in spin coating, the surface tension of the coat film and the like.

Additionally, it is preferable that after formation of the island-shaped protrusion layer on which island-shaped protrusions with a low surface energy are formed in a dispersed manner on the above-described gate insulating layer by the spin coating or spray coating method, the organic semiconductor layer is heated into a film under a temperature condition from 60° C. to 200° C., preferably from 80° C. to 180° C. Formation of the organic semiconductor layer under the specified temperature condition is preferable because, for example, when the pentacene derivative film is formed by vapor deposition, a C-axis orientation ratio of the pentacene derivative film becomes 85% or more.

In the next place, the present invention is an organic semiconductor device characterized in that the device utilizes the above-described organic semiconductor element as IC information electronic tag.

Description is made on an electronic tag smart card as an example of the organic semiconductor device of the present invention that utilizes the IC information electronic tag. Facilitation of the optical character recognition by attaching a tag with barcodes or codes to an article has long been practiced for the purpose of recognizing and searching for articles liable to be left or lost including product catalogs, pieces of baggage, paper vouchers, and other movable articles. Such optically detectable tags are needed to be held as visible for recognition; however, the tags easily tend to become unreadable owing to surface scars or other damages. For the purpose of improving the search reliability, attempts have been made on the methods using electronic tags based on radio frequencies. Such tags typically comprise a semiconductor memory for data storage, a processing logic, an antenna for data broadcasting; all of these are embedded in a vessel made of thermosetting resins including epoxy resin, thermoplastic resins, or other appropriate resins.

The range of data storage capacity typically extends from a few bits to a few kilobits, and is typically 64 bits. A tag can contain a read only memory (ROM), an electrically programmable or erasable ROM (EPROM or EEPROM) or a flash memory. An electronic tag is supplied with power by use of a durable small battery, a photovoltaic power source, a thermal converter, an induction power converter depending on electromagnetic energy applied externally, or other appropriate power sources. Formation of these electronic tags with those circuits which utilize organic semiconductor elements simplifies the production process and thereby permits price reduction.

In the next place, the present invention is an active matrix type display device characterized by the use of the above-described organic semiconductor element as an active element.

An active matrix liquid crystal display device is a device in which an active matrix is attached to each of the pixels constituting the display part and the liquid crystal is supplied with a voltage therethrough. As the driving method, the following system is adopted. Active matrix elements such as TFT's are arranged at the intersections of the n×m matrix wires composed of n rows of scanning lines and m columns of signal lines; the gate electrode, drain electrode and source electrode of each TFT are connected to a scanning line, a signal line and a pixel electrode, respectively; the scanning lines and signal lines are supplied with address signals and display signals, respectively; and the liquid crystals on the pixel electrodes are operated through the TFT switches controlled by the address signals superposed with on/off signals. Application of an organic semiconductor element to a switching element simplifies the production process and thereby permits price reduction.

More specific description is made below on the present invention by referring to Examples.

EXAMPLE 1

In the first place, description is made on the substrate used in the organic semiconductor device according to the present Example and the cleaning method.

The silicon substrate used in the present Example was a p-type substrate doped with boron. The resistivity of the substrate was 0.1 to 0.2 Ωcm. The crystal axis was <100>.

A $SiO_2$ film was formed on the silicon substrate. The $SiO_2$ film was 200 nm in film thickness, which was formed on the surface of the silicon substrate by the wet thermal oxidation method. The oxidation conditions were the furnace temperature set at 95° C. and the inflow ratio of $H_2$ and $O_2$ set at 0.5.

The cleaning method of the silicon substrate was as follows. Twice repeated was the process in which silicon substrate was soaked in acetone with a purity of 99% or higher and subjected to ultrasonic cleaning for 5 min and then the substrate was soaked in purified water and subjected to ultrasonic cleaning for 5 min. After the cleaning, purified water was blown away with $N_2$ gas, and then the substrate was irradiated with ultraviolet (UV) light of 184.9 nm and 253.7 nm in wavelength under the conditions that the intensity was 100 mW and the irradiation time was 20 sec to remove organic contamination. Then, the substrate was heated in a furnace at 250° C. for 1 hr in an $N_2$ atmosphere for the purpose of removing the moisture on the $SiO_2$ surface and thermally relaxing the carriers injected by the UV irradiation into the $SiO_2$ film.

Next, description is made on the production method of the island-shaped protrusion layer, in which island-shaped protrusions with a low surface energy is provided in a dispersed manner, to be used in the organic semiconductor element according to the present invention. As the fluorine polymer, perfluorooctyltrimethoxysilane manufactured by Toray Down Corning Co., Ltd. (trade name: AY43-158E) and represented by the following structural formula (21) was used in an alcohol solution (concentration: 10 wt %; viscosity: 3 cps):

$$CF_3(CF_2)_7Si(OCH_3)_3 \quad (21)$$

The average molecular weight of perfluorooctyltrimethoxysilane (AY43-158E) is 4,000. The above-described fluorine polymer solution was applied by the spin coating method while the above-described substrate having the $SiO_2$ film thereon was revolved at 1,500 rpm for 15 sec, and thus an island-shaped protrusion layer, on which island-shaped protrusions made of the fluorine polymer were dispersed, was formed on the surface of the $SiO_2$ film. Then, the substrate was baked in the atmosphere under the conditions of 150° C. and 20 min.

The shape of the fluorine-based polymer film formed on the substrate surface was observed on an AFM (tunnel type electron microscope) through image processing. The AFM image obtained is shown in FIG. 2. The void fraction of the island-shaped protrusion layer was 50%, and the height of the island-shaped protrusions was 0.5 nm and the average diameter of the island-shaped protrusions was 0.5 nm. The surface energy of the film of the fluorine-based polymer used for formation of the island-shaped protrusions was 20 dyn/$cm^2$.

Here is described the method used for measuring the above-described surface energy. The method was conducted by using a method of measuring the surface energy in the macroscopic surface state for each substrate of the liquid crystal element. The reagents used for contact angle measurement were, for example, A:α-bromonaphtalene, B:methylene iodide, C:water and the like. The contact angles were measured for A, B, C and the like, and then the surface energies were calculated on the basis of the calculation formula described, for example, in a paper by Kitasaki et al. titled "Extension of the Fowkes Formula and Estimation of the Surface Tension of Polymer Solids" published in the Adhesion Society of Japan, Vol. 8, No. 3 (1972), p. 131 forward.

Next, description is made below on the production method of the pentacene vapor-deposited film used for the semiconductor element according to the present invention.

The above-described silicon substrate having $SiO_2$ film formed thereon was used as the substrate.

The used raw material powder of pentacene was a commercially available powder of pentacene which was sublimed for purification. The pentacene vapor-deposited film was produced using a vacuum vapor deposition apparatus capable of vacuum-exhausting by means of a diffusion pump. The formation conditions of the pentacene vapor-deposited film were as follows. The achieved vacuum in the vapor deposition apparatus chamber was 3 to $5\times10^{-4}$ Pa. The above-described pentacene powder was put into a K-cell, the substrate was arranged at a position of about 20 cm above the boat, the cell was heated to about 260° C., and thus the pentacene was sublimed and deposited onto the surface of the substrate. The substrate was heated at 125° C. with a heater board, a quartz oscillator was equipped at a height nearly the same as the height of the position of the substrate on the heater board, and the film thickness and vapor deposition rate were calculated from the resonance frequency variation of the oscillator. The thickness of the pentacene film was set at 150 nm.

Table 1 shows the production conditions for four types of matrixes used in the present experiment.

The production condition No. 1 was to use a substrate subjected to cleaning process but not to coating the $SiO_2$ film with a fluorine polymer, and to form a film at the substrate temperature set to room temperature (24° C.) and at an average vapor deposition rate of 7.5 Å/sec.

The production condition No. 2 was to use perfluorooctyltrimethoxysilane (trade name: AY43-158E) manufactured by Toray Dow Corning Co., Ltd. for the island-shaped protrusion layer, and the film was formed with the substrate temperature set at room temperature and at an average vapor deposition rate of 7.5 Å/sec.

The production condition No. 3 was not to coat the $SiO_2$ film with a fluorine-based polymer, and to form a film at the substrate temperature set to 125° C. and at an average vapor deposition rate of 7.5 Å/sec.

The production condition No. 4 was to use perfluorooctyltrimethoxysilane (trade name: AY43-158E) manufactured by Toray Dow Corning Co., Ltd. for the island-shaped protrusion layer, and to form a film at the substrate temperature set to 125° C. and at an average vapor deposition rate of 7.5 Å/sec.

As described above, the pentacene vapor-deposited films were perfected.

TABLE 1

| Production condition No. | Island-shaped protrusion layer | Substrate temperature (° C.) | Vapor deposition rate (Å/sec) | Mobility μ (cm²/Vs) | On/off ratio |
|---|---|---|---|---|---|
| 1 | None | Room temperature | 7.5 | 0.04 | $0.6 \times 10^5$ |
| 2 | AY43-l58E | Room temperature | 7.5 | 0.12 | $1.5 \times 10^5$ |
| 3 | None | 125° C. | 7.5 | 0.09 | $1.5 \times 10^5$ |
| 4 | AY43-l58E | 125° C. | 7.5 | 0.21 | $0.9 \times 10^5$ |

Next, description is made with reference to FIGS. 3A to 3D on the wide-angle X-ray measurement results for the pentacene vapor-deposited films formed according to Example 1.

FIGS. 3A to 3D show respectively the X-ray diffraction charts obtained for the pentacene vapor-deposited films produced according to the four production conditions (No. 1 to No. 4) shown in Table 1. Numeral 201 of FIG. 3A denotes a peak of the wide-angle X-ray chart of the No. 1 pentacene vapor-deposited film; 202 of FIG. 3B, a peak of the No. 2 film; 203 of FIG. 3C, a peak of the No. 3 film; and 204 of FIG. 3D, a peak of the No. 4 film.

The X-ray used for measurement was the copper K-alpha ray of 0.15406 nm. The tube voltage of the X-ray source was set at 30 kV, and the tube current was set at 30 mA. A slit was equipped between the sample and the X-ray source and was set in such a way that the cross section for X-ray on the sample surface was 2×2 mm². Using a wide-angle goniometer, the angle between the incident X-ray path and the substrate surface normal was set to be $(90-\theta)°$, and the angle between the reflection path directed to the detector and the substrate surface normal was set to be $(90-2\theta)°$. A scintillation counter was used as the detector. The scanning range was θ:1.5 to 15° and the step width was 0.2°. The sampling time for each incident angle θ was 5 sec.

As FIG. 3 shows, in the X-ray peaks 201, 202, 203, 204 from the pentacene vapor-deposited films, the peaks corresponding to the interplanar spacing of 1.57 nm were observed at 2θ=5.6°, 11.4°, 17.1°, 23.0°, respectively. Additionally, the peaks corresponding to the interplanar spacing of 1.49 nm were observed at 2θ=6.0°, 12.1°, 18.3°, 24.6°, respectively. Furthermore, the peaks corresponding to the interplanar spacing of 0.67 nm were observed at 2θ=9.4°, 11.7°, 24.1°.

In the X-ray peak 203 (No. 3) from the heated substrate and the X-ray peak 202 (No. 2) from the substrate coated with a fluorine film, two peaks were respectively observed around 2θ=5.6° and 6.0°; on the other hand, instead of two peaks, one peak was observed in the X-ray peak 204 (No. 4) from the pentacene vapor-deposited film formed, while heating the substrate, on the island-shaped protrusion layer; and the peak intensities were extremely low and the peak intensities corresponding to the interplanar spacings of 6 to 7 Å were observed in the X-ray peak 201 (No. 1) for the pentacene vapor-deposited film on the substrate subjected to no particular pretreatment.

According to the literature (R. B. Campbell, J. M. Robertson, and J. Trotter, "Acta Crystallogr.", Vol. 14, p. 705 (1961)), the pentacene single-crystal is triclinic, and the lattice constants for the a-axis, b-axis and c-axis are respectively a=7.90 Å, b=6.06 Å and c=16.01 Å. The angles between the a- and c-axes, the b- and c-axes, and the a- and b-axes are respectively α=101.9°, β=112.6°, and γ=85.5°.

Calculation of the indexes for the peaks appearing in the wide-angle X-rays by using the above-described literature's values showed that the peaks corresponding to the interplanar spacing of 1.49 nm were represented by (00l) (l=1, 2, 3, 4); additionally, the peak for 2θ=19° was identified as (200) and the peak for 2θ=23° was identified as (110).

A pentacene molecule is about 16 Å in lengthwise length, as can be seen from the above-described formula (19). Thus, because the interplanar spacing along the substrate surface normal is 1.49 nm, a pentacene molecule in a single-crystalline layer probably takes an alignment tilted from the normal. On the other hand, because the interplanar spacing for the thin film layer is 1.57 nm, a pentacene molecule therein probably takes an alignment nearly parallel to the normal, namely, normal to the substrate.

From the above description, the pentacene vapor-deposited film of the condition No. 1 formed on the SiO$_2$ film at room temperature was revealed to take the condition that most molecules lie parallel to the substrate, a fraction of molecules tilted from the normal, and another fraction of molecules were normal to the substrate surface. On the other hand, in the pentacene vapor-deposited films of the condition No. 2 to No. 4 (No. 2 to No. 4 in Table 1), no molecules lie parallel to the substrate surface, but there coexisted the molecules normal to the substrate and molecules tilted. In particular, in the case of the condition No. 4 where the temperature was elevated and an island-shaped protrusion layer was present, the proportion of the single-crystalline portion was increased because one peak appeared in the wide-angle X ray.

For Comparative Examples, island-shaped protrusion layers were formed with materials having different surface energies, and the relation between the C-axis orientation ratio and the surface energy was investigated. Particularly, the layers were used in which surface energies were varied by controlling the fluorine group proportion for the surface, and it cannot necessarily be stated that the C-axis orientation ratio and the surface energy are correlated with each other, but it can be seen from the C-axis orientation ratios from X-ray in Table 2 that the proportion of molecules parallel to the substrate normal direction increases with decreasing surface energy.

TABLE 2

| Material having different surface energy | Surface energy (dyn/cm²) | C-axis orientation ratio |
|---|---|---|
| PFA | 10 | 85% |
| PTFE | 15 | 90% |
| PMMA | 30 | 95% |
| Polyimide | 35 | 80% |
| Polystyrene | 40 | 70% |
| Fluorinated polyimide 1 | 5 | 95% |
| Fluorinated polyimide 2 | 8 | 90% |
| Fluorinated polyimide 3 | 11 | 85% |

(Notes)
PFE: Tetrafluoroethylene
PTFE: Polytetrafluoroethylene
PMMA: Poly(methyl methacrylate)
Fluorinated polyimide 1: polyimide with fluorine modification ratio of 20%
Fluorinated polyimide 2: polyimide with fluorine modification ratio of 10%
Fluorinated polyimide 3: polyimide with fluorine modification ratio of 5%

In the next place, description is made below on the production method of the organic semiconductor of the present invention.

Figure 5A:
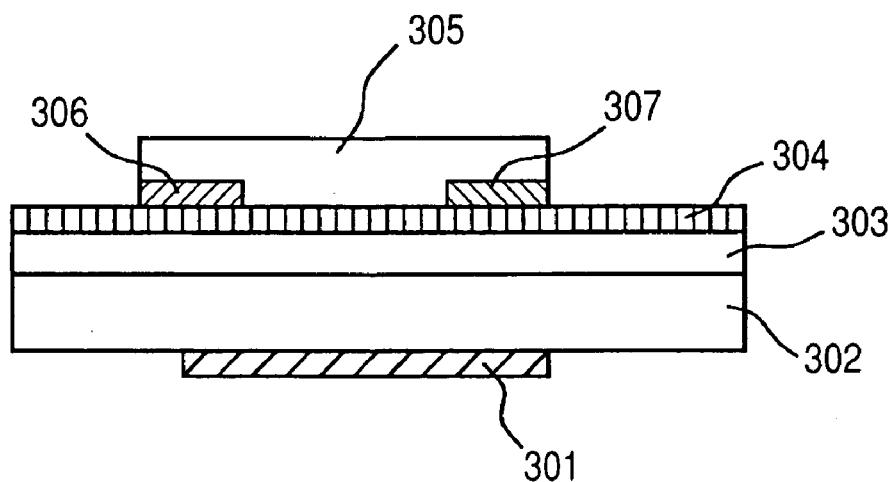
FIGS. 5A and 5B are schematic diagrams showing the organic semiconductor element of Example 1 in the present invention.
Figure 5B:
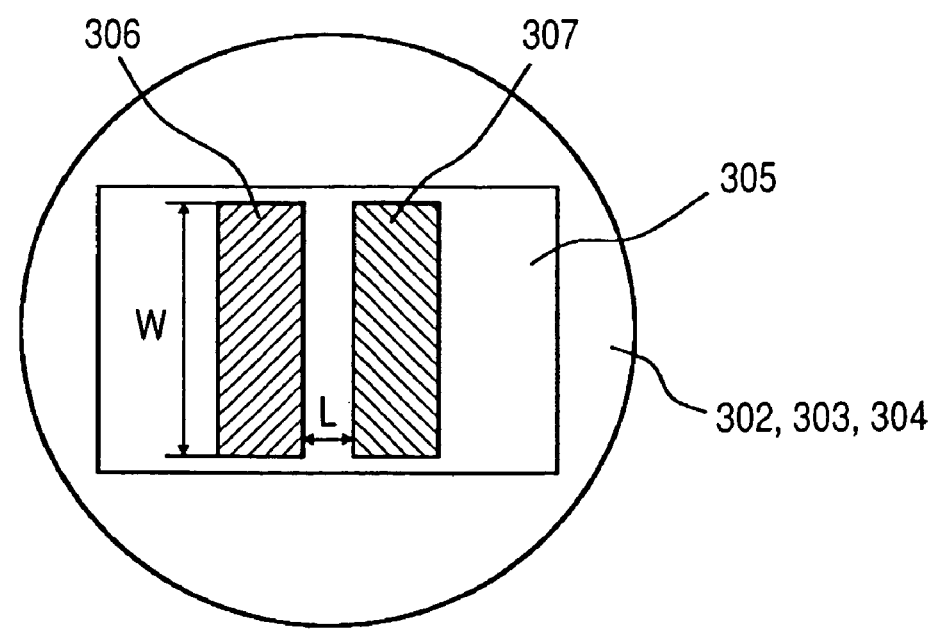

FIGS. 5A and 5B are the schematic diagrams showing the organic semiconductor element of Example 1 of the present invention. FIG. 5A shows the sectional view of the organic semiconductor element, and FIG. 5B shows a plan view of the organic semiconductor element. Reference numeral 302 denotes a silicon substrate, reference numeral 301 denotes silver paste formed on the back side of the silicon substrate 302, namely, a gate electrode, reference numeral 303 denotes a $SiO_2$ film, 304 an island-shaped protrusion layer formed on the $SiO_2$ film with a fluorine polymer, 305 a pentacene vapor-deposited film, 306 a source electrode, and 307 a drain electrode.

With a mask for metal deposition placed on the pentacene vapor-deposited film 305, the source electrode 306 and drain electrode 307 were produced by the vapor deposition method. The material for electrode was gold. The production conditions for the electrodes were as follows. The maximum vacuum achieved in the chamber was $3\times10^{-5}$ Pa. The substrate temperature was set at room temperature. A string of thin, pure gold wire of 99.9% or higher purity was put in a Mo metal boat for resistance heating, a substrate was arranged at a position of about 30 cm above the boat, and the boat was heated and gold was vapor deposited. The average vapor deposition rate was set at 0.5 nm/sec. Additionally, the film thickness of the vapor-deposited gold film was set to 100 nm. The separation distance L between the source electrode and drain electrode was made to be 0.1 mm, and the lengths of the source and drain electrode were made to be 30 mm. Then, the back side of the substrate was applied with silver paste for forming the gate electrode.

As described above, the organic semiconductor element using a pentacene deposited film (pentacene TFT) was perfected.

Next, description is made below on the TFT characteristics of the organic semiconductor element of the present invention with reference to FIGS. 6 to 9.

The Vg-Id curve was measured with a measurement system having the following configuration. Measurements were made using a measurement apparatus 4156C (trade name) manufactured by Agilent Co. The organic semiconductor element was fixed on the metallic stage using a vacuum chuck, and the gate voltage Vg was applied to the silver paste 301 from the stage. Prober needles of 0.5 mm in diameter were brought into contact with the source electrode 306 and drain electrode 307 in the organic semiconductor, and the drain voltage Vd was applied.

Figure 6:
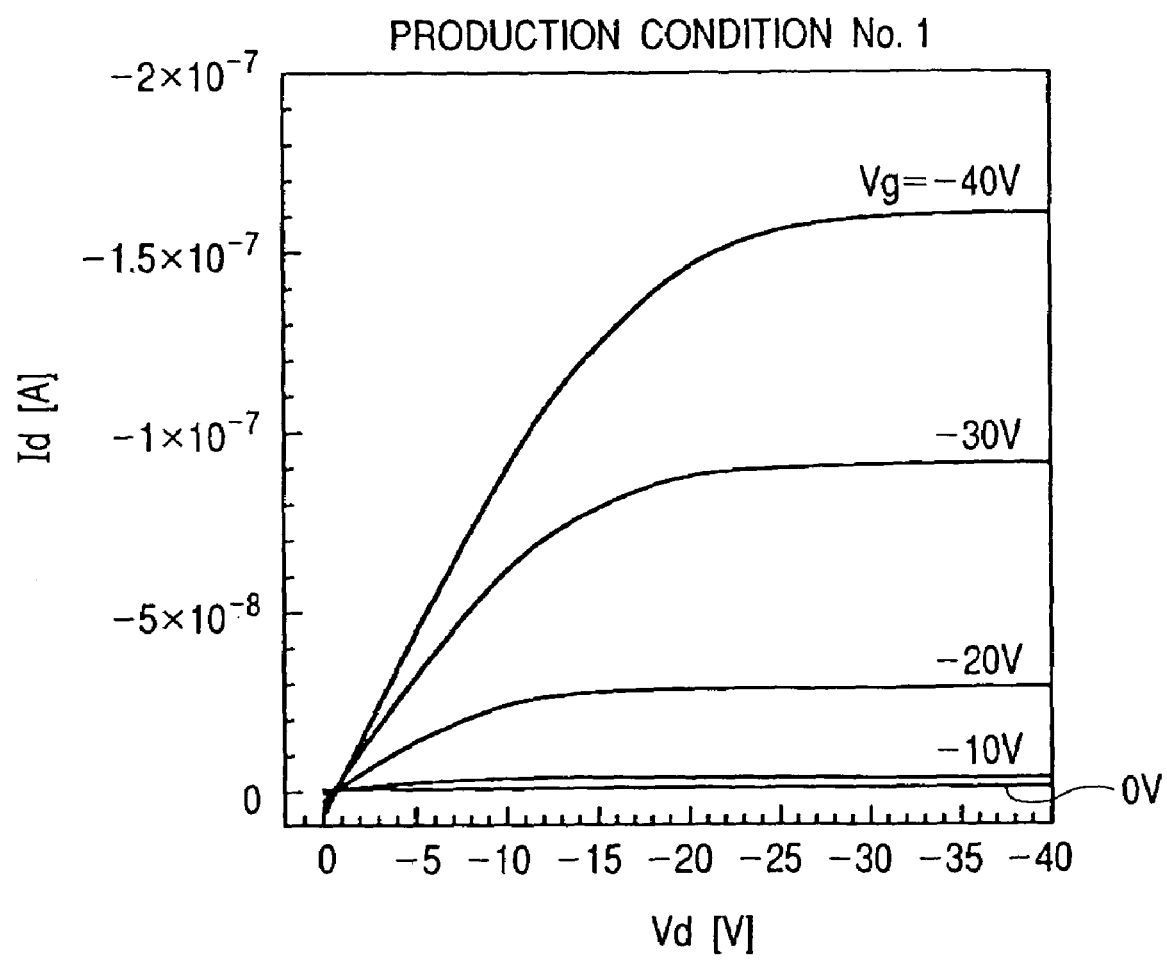
FIG. 6 is a graph showing the TFT characteristics of an organic semiconductor element of the present invention.
Figure 7:
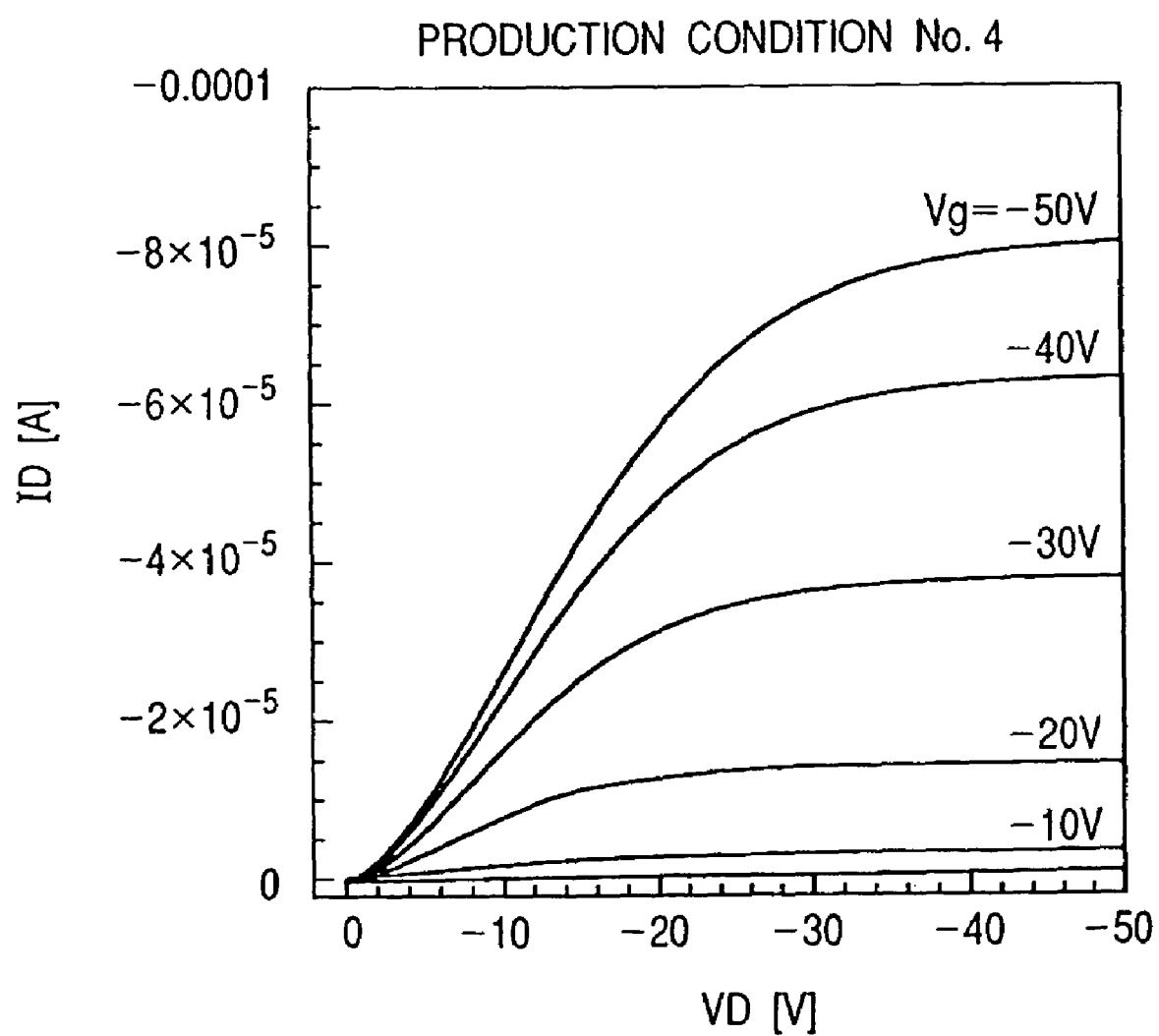
FIG. 7 is a graph showing the TFT characteristics of an organic semiconductor element of the present invention.
Figure 8:
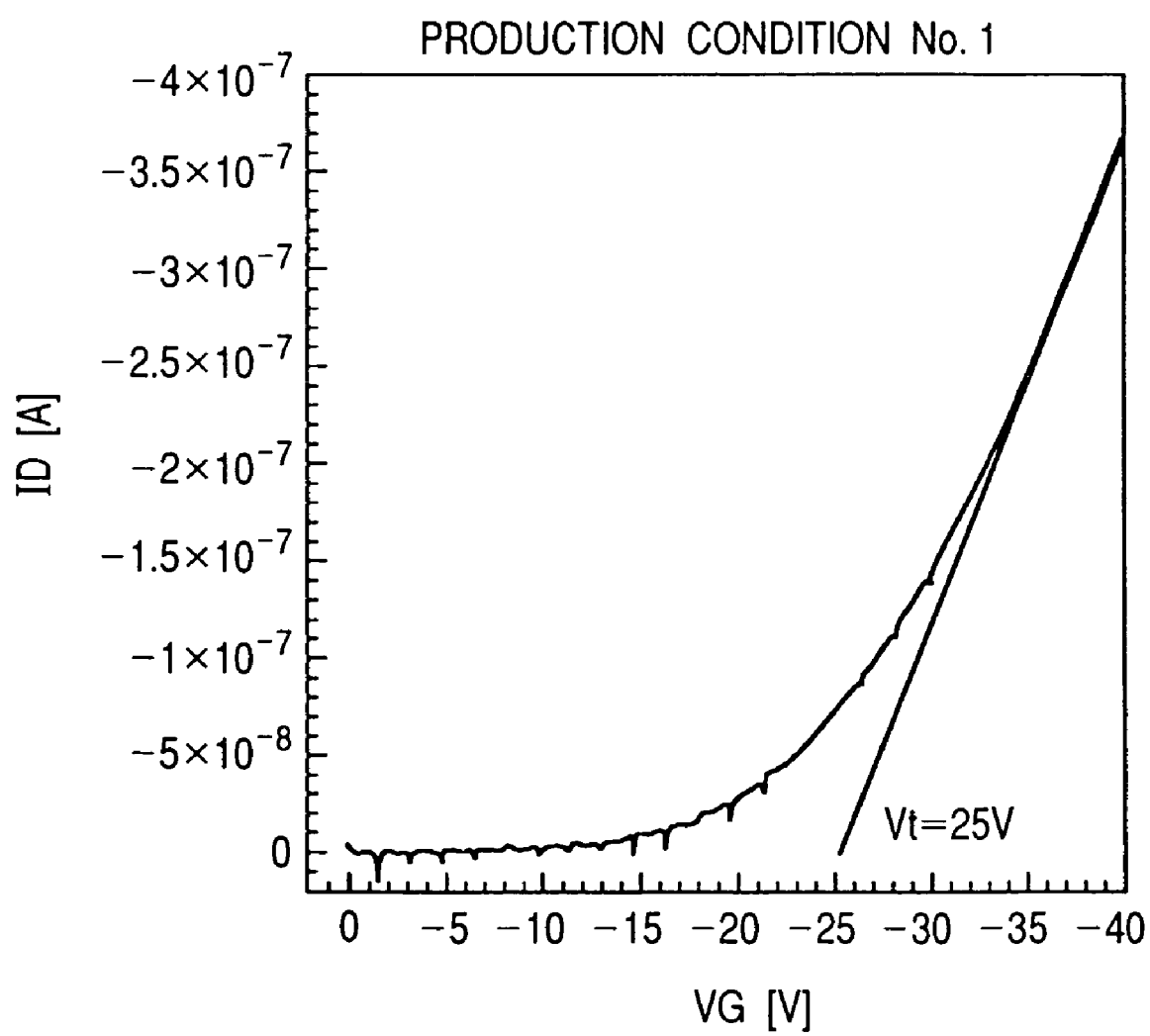
FIG. 8 is a graph showing the TFT characteristics of an organic semiconductor element of the present invention.
Figure 9:
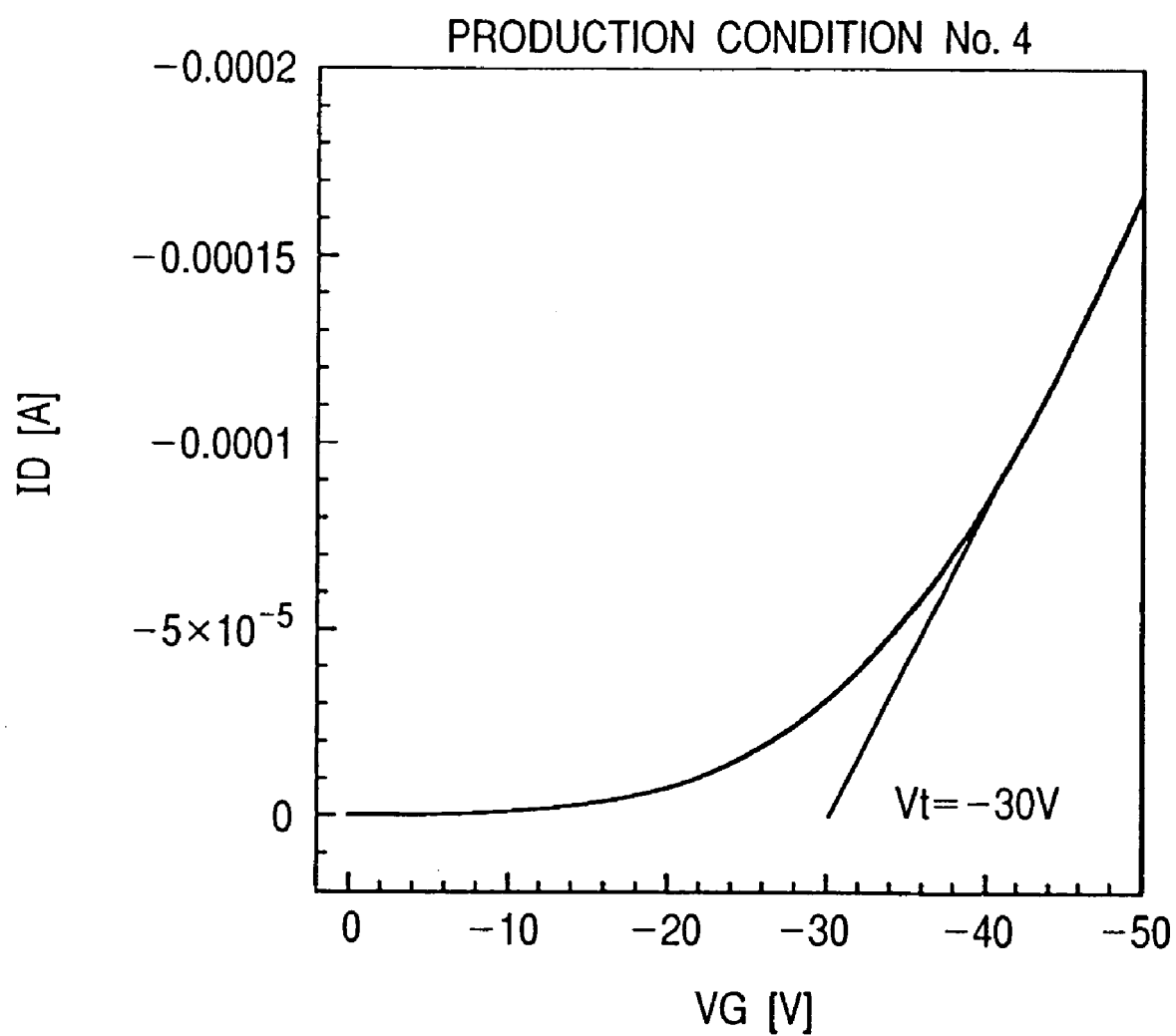
FIG. 9 is a graph showing the TFT characteristics of an organic semiconductor element of the present invention.

FIG. 6 shows the Vd-Id curves for the pentacene TFT obtained varying the gate voltage applied to a sample formed according to the production condition No. 1 in Table 1, FIG. 7 shows the Vd-Id curves for the pentacene TFT obtained varying the gate voltage applied to a sample formed according to the production condition No. 4, FIG. 8 shows the Vd-Id curve for an organic semiconductor element in which a substrate according to the production condition No. 1 was used, and FIG. 9 shows the Vg-Id curve for an organic semiconductor element in which a substrate according to the production condition No. 4 was used. Here, Vg=−40 V.

In the semiconductor element involved in FIG. 6, based on the production condition No. 1, in which a pentacene vapor-deposited film was produced directly on the $SiO_2$ film, Id increases around Vg=−34 V and a current of Id=$1.6\times10^{-7}$ A flows at Vd=−40 V. At this time, the on/off ratio is $0.6\times10^5$.

On the other hand, in the semiconductor element involved in FIG. 9, based on the production condition No. 4, in which a pentacene film was produced at an elevated temperature on the island-shaped protrusion layer formed of a fluorine-based polymer, Id abruptly increases around Vg=−26 V and a current of Id=$5.8\times10^{-5}$ A flows at Vg=−40V. The on/off ratio of the element is $0.9\times10^5$.

Similarly, the current values were also obtained for the conditions No. 2 and No. 3. The results thus obtained are collected in Table 1.

The mobilities were calculated according to the following formula (1):

$$\text{Mobility } \mu = (\text{linear region slope in } V_g - \sqrt{I_d})^2 \times (1/C_i) \times (L/2W) \quad \text{(Formula 1)}$$

Here, $C_i$ is for the electrostatic capacity of the gate insulating film of $1\times1$ cm$^2$, and W and L are respectively the channel length and channel width as shown in Example.

The mobilities obtained for the conditions No. 1 to No. 4 are shown in Table 1. The mobilities μ increased in the organic semiconductor elements in which the pentacene vapor-deposited film was produced on the island-shaped protrusion layer having island-shaped protrusions with a low surface energy which were scattered (No. 2 and No. 4), as compared to that in the organic semiconductor element in which the pentacene vapor-deposited film was produced directly on the $SiO_2$ film. On the other hand, as for the on/off ratios, there were found no differences.

From those described above, it can be found that the TFT characteristics are improved in the pentacene vapor-deposited film by the production thereof on the scattered and island-shaped protrusion layer with a low surface energy by the substrate heating.

As shown in FIGS. 3A to 3D for X-ray analysis, no pentacene molecules lie parallel to the substrate surface in the pentacene vapor-deposited films formed in contact with the island-shaped protrusion layer on which island-shaped protrusions with a low surface energy are scattered. Accordingly, the intermolecular migration of the carrier can easily occur so that the mobilities probably become large. Additionally, the intensity ratios corresponding to the C-axis of the single crystalline layer becomes large, and in the case of the single crystalline fraction of 85% or more parallel to the substrate normal direction, the TFT characteristics with a high mobility can be obtained.

Consequently, according to the present invention, it can be found that the TFT characteristics are obtained by forming on a $SiO_2$ film the island-shaped protrusion layer on which island-shaped protrusions with a low surface energy are scattered.

EXAMPLE 2

Description is made below on the embodiment in which the organic semiconductor element according to the present invention was utilized in an active matrix liquid crystal display device, with reference to FIGS. 10 through 12C.

Figure 10:
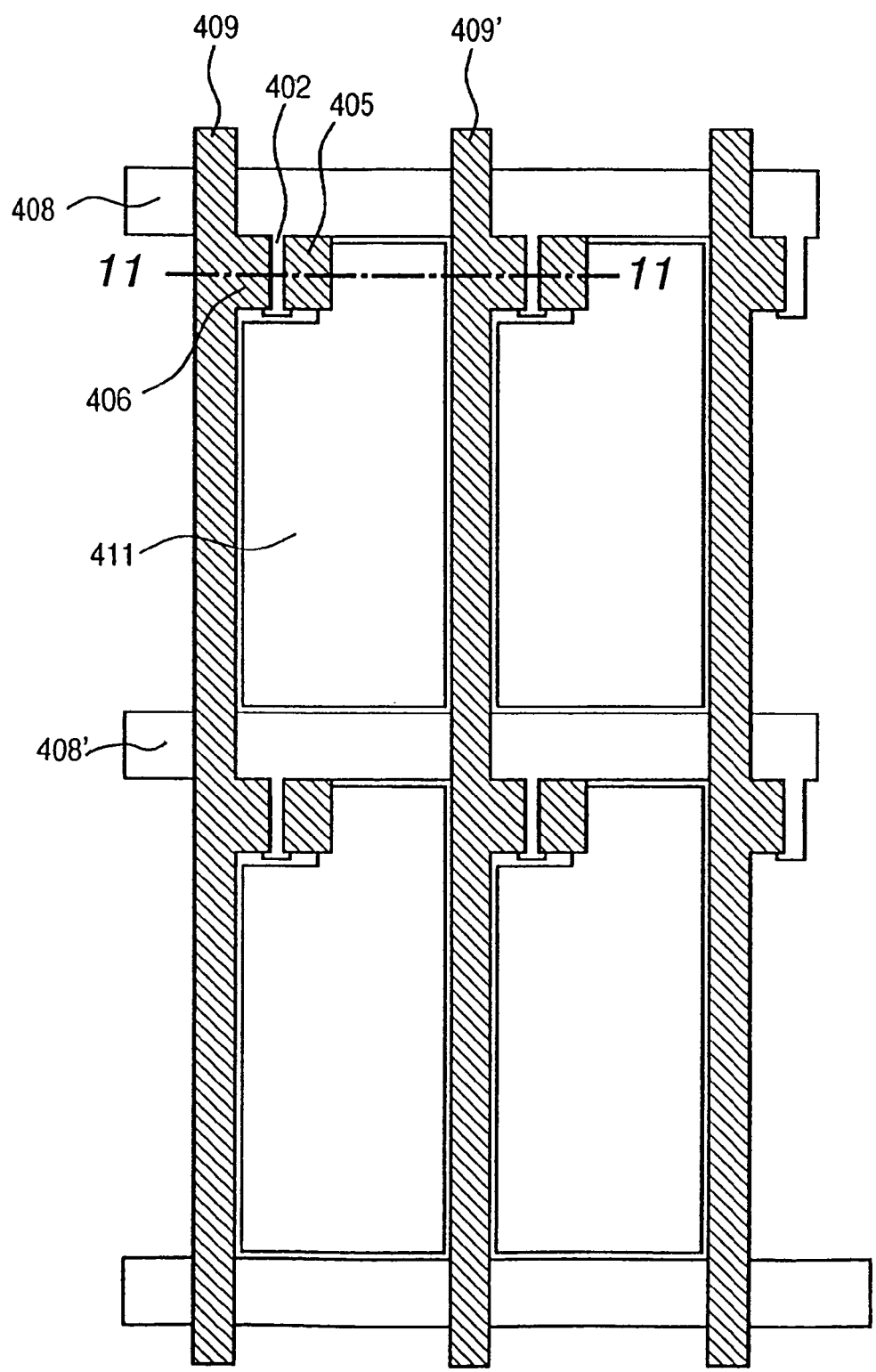
FIG. 10 is a diagram showing an active matrix liquid crystal display device according to the present invention.

FIG. 10 shows the active matrix liquid crystal display device according to the present invention.

Figure 11:
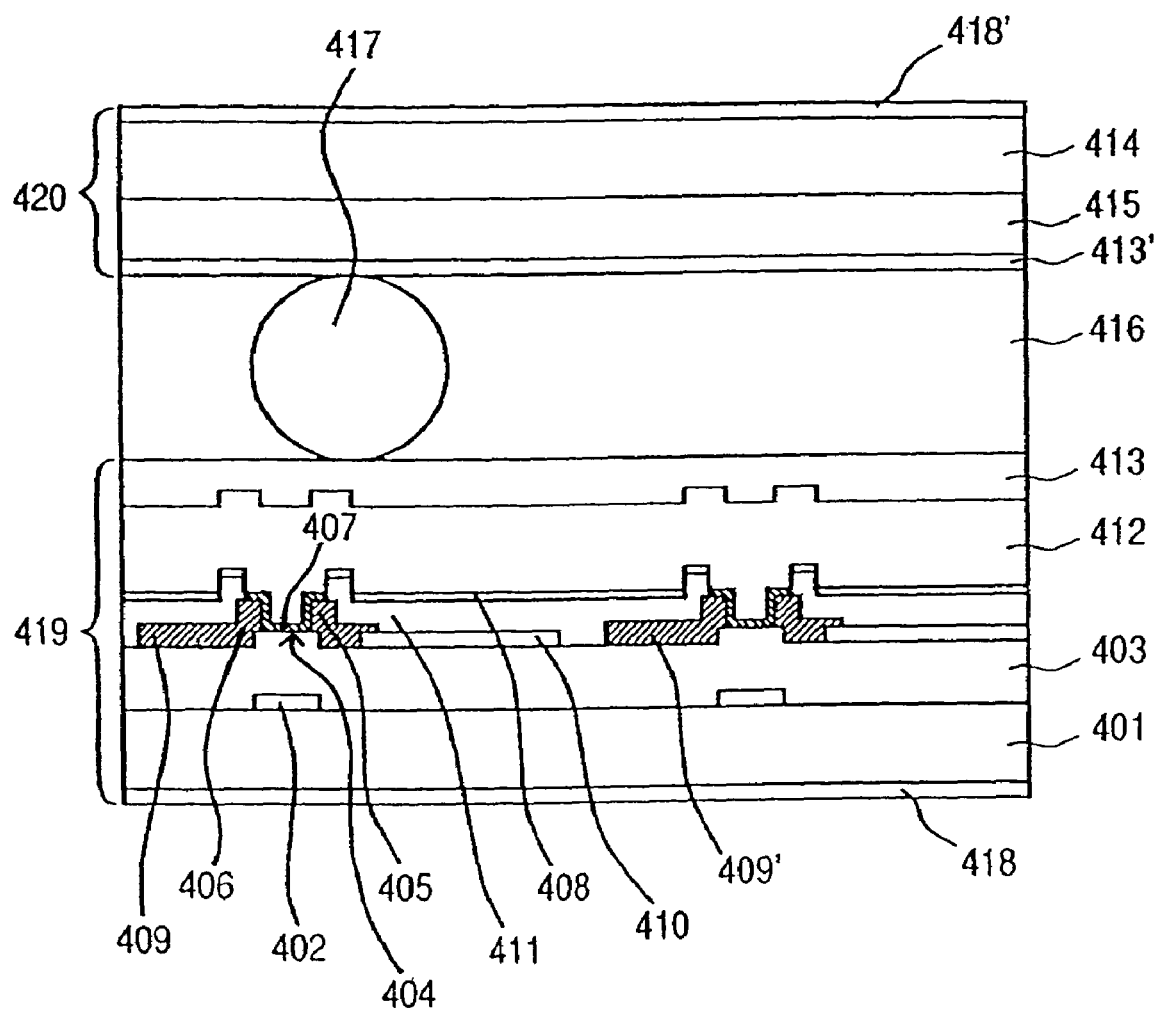
FIG. 11 is a sectional view of the active matrix liquid crystal display device taken along the line 11—11 of FIG. 10.

FIG. 11 shows a sectional view of the active matrix liquid crystal display device taken along the line 11—11 of FIG. 10. Reference numeral 401 denotes a glass substrate, 402 a gate electrode, 403 a gate insulating film, 405 a source electrode, 406 a drain electrode, 407 a pentacene vapor-deposited film, 408 and 408' signal wires, 409 and 409' scanning wires, 410 a pixel electrode, 411 a SiNx protective film, 413 and 413' oriented films, 414 a glass substrate, 415 an opposed electrode, 416 a liquid crystal composition, 417 a spacer bead, 418 and 418' polarization plates, 419 a TFT substrate, and 420 an opposed substrate. Reference numeral 404 denotes an interface between the pentacene vapor-deposited film 407 and the gate insulating film 403. FIGS. 12A through 12C show the production steps (Steps 601 through 622) for the active matrix substrate display device shown in FIGS. 10 and 11.

In the first place, the TFT substrate 419 was produced according to the operation steps shown in FIG. 12A. A Cr film of about 150 nm in thickness was formed on a nonalkali glass substrate 401 in the sputtering method (Step 601). The Cr film was patternized in the photolithography step to form the scanning wire 409 and gate electrode 402 (Step 602). A $SiO_2$ film of 300 nm in thickness and a SiN film 403 of 200 nm in thickness were formed thereon by the sputter method (Step 603). An ITO thin film of 300 nm in thickness was formed thereon by the sputtering method, and then patternized in the photolithography step to form the pixel electrode 410 (Steps 605 and 606). A Cr film of 20 nm in thickness was formed thereon by the sputter method, and patternized in the photolithography step to form the signal wire 408, source electrode 405 and drain electrode 406 (Steps 607 and 608). Furthermore, a Au thin film of 150 nm in thickness was formed thereon by the vapor deposition method, and patternized in the photolithography step to form the signal wire 408, source electrode 405 and drain electrode 406 (Steps 609 and 610). The Cr film was used to improve the adhesiveness between the Au film and $SiO_2$ film.

Furthermore, an island-shaped protrusion layer was formed thereon, following the contents described Example 1 (Step 611). The average height of the island-shaped protrusion layer was 1 nm. A pentacene vapor-deposited film of 80 nm in thickness was formed thereon (Step 612). The production conditions for the pentacene vapor-deposited film was the same as those in Example 1. A drain voltage Vd=−40 V was applied for 10 seconds in order to flow a current between the source electrode and the pentacene film and the drain electrode. Furthermore, an epoxy resin thin film of 500 nm in thickness was formed thereon as a protective film 412 (Step 613). Then, the holes for accessing the signal wire 408 and scanning wire 409 were formed in the photolithography step (Step 614). The oriented film 413 of 200 nm in thickness was formed thereon by the oblique vapor deposition (Step 615). As described above, the TFT substrate 419 was perfected.

Next, the opposed substrate 420 was formed according to the operation steps shown in FIG. 12B. The ITO opposed electrode 415 of 140 nm in thickness was formed on the nonalkali glass substrate 414 by use of the sputter method (Step 616). The oriented film 413' of 200 nm in thickness was formed thereon by use of the oblique vapor deposition method (Step 617).

The liquid crystal panel was produced according to the operation steps shown in FIG. 12C. After the orientation processing of the surfaces of the oriented films 413 and 413' respectively on the TFT substrate 419 and the opposed substrate 420 (Step 618), the spacer beads 417 made of silicon oxide with 3 μm in diameter were dispersed on the surface of the TFT substrate 419 (Step 619). The liquid crystal composition 416 was introduced into the gap formed between the TFT substrate 419 and the opposed electrode 420 (Step 620). The polarization plates 418 and 418' were attached respectively to the surfaces of the TFT substrate 419 and the opposed substrate 420, and thus the liquid crystal panel was formed (Step 621).

In the present Example, according to the same manners as in Example 1, the pentacene vapor-deposited film was produced on the island-shaped protrusion layer, which was an underlying layer, having scattered and island-shaped protrusions with a low surface energy, and accordingly the characteristics of the organic semiconductor element exhibited satisfactory values, as similarly in the case of Example 1, such that the mobility was 0.21 $cm^2$/Vs and the on/off ratio was $1 \times 10^5$. The above-described liquid crystal display device was evaluated under the lighted condition, and the pixel contrast ratio was found to be 150, yielding a satisfactory display.

EXAMPLE 3

Description is made on a production method of the IC information tag.

Figure 13:
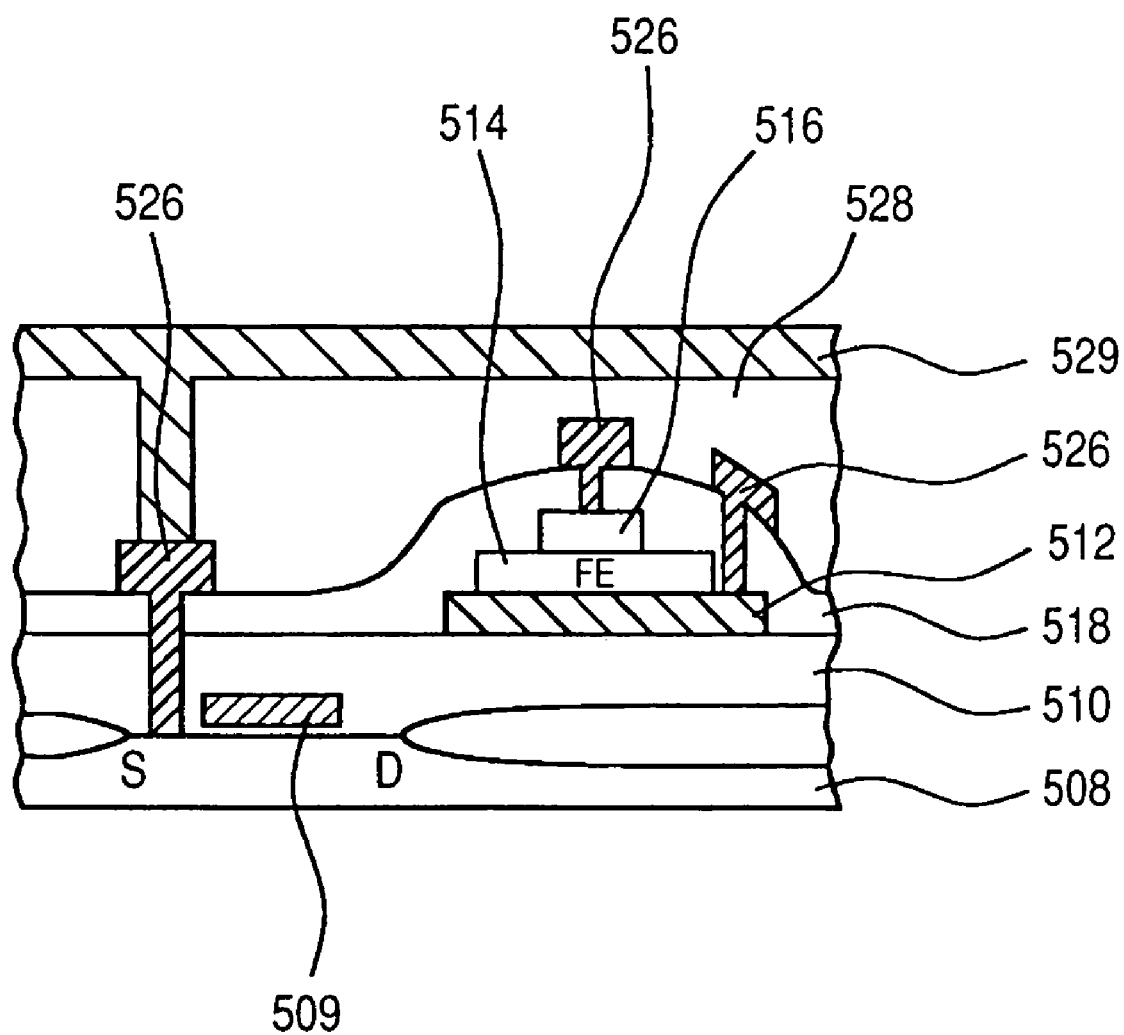
FIG. 13 is an illustrative diagram showing a portion of an IC board.

As for the explanation of FIG. 13, FIG. 13 shows a portion of an IC substrate. For simplicity of FIG. 13, only one inverted TFT is shown, but this one device is a large integrated array device. In FIG. 13. reference character 508 denotes a silicon substrate, 509 an organic semiconductor layer, 510 a resin insulating film. 512 a lower electrode, 514 a ferroelectric layer, 516 an upper electrode, 518 a resin insulating film, 528 an insulating film, 529 a metal wiring, 526 a conductive layer formed by embedding a metal in a through-hole, S a source electrode, and D a drain electrode. Additionally, the elements and the like shown in the figure are not accurately scaled. The IC information tag in the present Example has a structure in which an organic semiconductor is arranged on the downside, and a dielectric memory is stacked thereover. In the present invention, an organic dielectric memory is used, and two transistors are used to operate the memory. If the degree of integration is not taken into account, an inorganic dielectric can be combined in one and the same plane. A structure is also possible in which one dielectric is allotted to one transistor. Additionally, an organic transistor may be formed on an organic dielectric memory, in a reversed manner.

Figure 14:
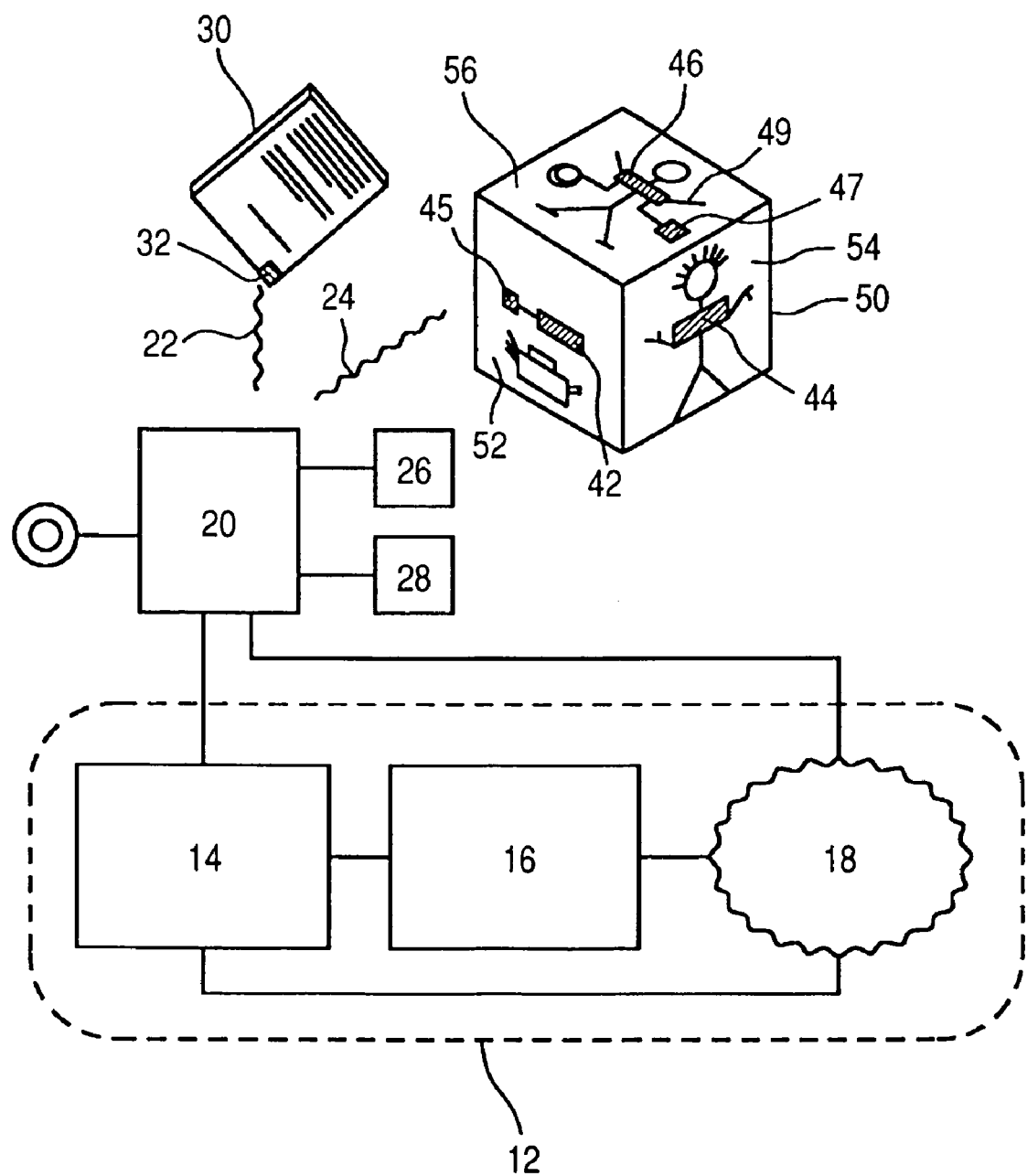
FIG. 14 is a schematic diagram showing an example of an IC information electronic tag in the present invention.

FIG. 14 is a schematic diagram showing a system 10 that identifies a plurality of tags 42, 44, 45, 46 and 47 (usually each tag having an electronically readable specific identification number) and provides a variety of digital services in response to presentation of these electronic tags to electronic tag readers 20, 26 and 28. For the purpose of accessing the digital services, an electronic tag reader 20 (or electronic tag readers 26 and 28) is connected to a computer system 12, and the computer system further comprises a local computer 14, a database server 16, and a networked computer (network server) 18.

In the embodiment presented here of the present invention, the organic semiconductor elements are used for tags. An electronic tag 32 is attached to a paper document 30 with a clip, and electronic tags 42, 44, 45, 46, 47 are respectively attached to the faces 52, 54, 56 of a cube-shaped polygon. The determination as to which digital service has been called is made with the aid of various literal, graphic or symbolic marks (not shown in the figure). The marks are arranged respectively near the electronic tags 42, 44, 46. The electronic tag 32 or the electronic tags 42, 44 and 46 carried near one or more tag readers, and the inquiry/response signals 22 and 24 are transmitted between the electronic tags and the tag readers, and thus the read out identification numbers of the electronic tags are transferred to the computer system.

Electronic tags can be attached to various objects either durably or temporarily. These various objects are not limited to, but include paper documents 30, polygons 50, books, magazines, posters, notecards, printed advertisements, walls, floors, ceilings, articles of furniture, electronic devices, mobile computers, containers, cardboard boxes, clothes, and other appropriate objects. Durable attachment of the electronic tags to the objects can be achieved by one of methods selected from their embedment into the objects, their adherence to the surface of the objects, their fixation to the objects through a stapler, or any other appropriate mechanism to tightly attach them to the objects.

Temporal attachment of the electronic tags to the objects can be achieved by using clips, clasps, or strings (for example, a paper clip with an electronic tag attached, a rubber band or string ring with an electronic tag attached), by a simple scattering for arrangement (for example, tossing an electronic tag onto the floor), by inserting into slots or storage spaces, or by using other appropriate mechanisms for temporal attachment. Such a mechanism for temporal attachment makes it possible to establish continuous association with the various objects with tags attached; furthermore, the use of organic semiconductor elements offers an advantage that recycle of electronic tags can be easily achieved.

FIG. 14 is a schematic diagram showing an example of an IC information electronic tag in the present invention.

In FIG. 14, an object that has one or more tags attached is shown as the polygon 50. The polygon 50 contains a plurality of electronic tags 42, 44, 45, 46, 47, which are attached respectively to the faces 52, 54, 56. Rotation of the polygon 50 substantially allows one face and the tags attached to the center thereof to be presented to the electronic tag reader 20. Electronic tags can be attached to any portions in the polygon 50, for example, either to the edges and vertexes of the polygon 50, in a random distribution in relation to the polygon or in a semi-random distribution, or to the centers of the faces as shown in the figure in a symmetric distribution.

The use of such polygons (for example, a cube, a tetrahedron, a rhombic dodecahedron, a planar solid body with two surfaces, or related shapes) and attachment to the centers of the faces thereof provide an advantage that the faces offer passive shielding such that a large number of tags can be prevented from simultaneous reading. The polygon 50 is shown as a solid object, and various other shapes are also included within the scope of the present invention. For example, the global shape may resemble one of a variety of orthogonal prisms, may take a spheroid, an ellipsoid, a conical body of revolution, a plane, an indefinite shape, or a body sufficiently forgeable so that the user can determine the shape of the object. Additionally, there are included a large number of cooperative components with shapes in conformity with the electronic tags; the components include usual constitutions permitting the connection between a large number of shapes that uses connected objects including a ball and a socket, a key and a lock, slidable or rotatable connection forming parts, chains, or others.

Such organic electronic tags, according to the present invention, suitable for attachment to the above-described objects, usually broadcast specific identification numbers and arbitrary data on various selected radio frequencies. The identification number depends on a particular memory system that is used, may be allocatable by the user when the electronic tag is activated, may be alterable by the user through software instruction, or may be fixed by the organic tag manufacturer. In a particular embodiment, infrared ray, ultrasonic wave, or other appropriate data transfer systems are used each alone or in combination with radio frequency tags, and specific identification numbers or related data can also be broadcast. An organic electronic tag may be supplied with electric power by an external electromagnetic coil in a inductive manner, by an internal battery, by a photovoltaic cell, by a small amount of electric current obtained from general household electric current when available, or by other appropriate electric power supply mechanisms. Broadcasting of the identification numbers and/or data may be either continuous or intermittent, may respond to random periods of external status inquiries, and may respond to local power supply to electronic tags.

The electronic tag 46 can arbitrarily be equipped with a sensor. A variety of sensor modes can be supported, and the sensor modes include the absolute or relative positional information determined by gyroscope sensors, accelerometers, or sonic or infrared range of technology. Compatible is the presence of environmental sensors which include conventional light, image, heat, electromagnetic, vibration or sonic sensors. Depending on the desired application methods, environmental or positional sensors can be used. Such positional sensors incorporate differential GPS positional detection, image analysis or recognition, sonic or sound identification, or differential heat sensors. The sensors may include accelerometers, compressive deformation or tensile deformation sensors, or other embedded or attached sensors.

In special application examples, continuous sensors (for example, a capacitance sensor made of a two-layer sheet) may be used. One of the particularly effective continuous sensors is a sensor that uses a large number of capacitances or resistance strips and generates analog signals capable of specifying position proportional to the deformation pressure as a result of the deformation pressure. There can be used various types of sensors including simple capacitance sensors, resistance deformation (stress) sensors, analog or digital pressure switches, inductive sensors, or fluid flow sensors. Depending on the types of the sensors used, the sensor data can also be transferred directly to the electronic tag 46 in a digital form, or can be converted to a digital form through a general purpose analog-digital converter typically offering a range from 4 to 8 bits (however, various applications may demand various ranges from 1 bit, the smallest, up to 32 bits, the largest). The use of such sensors provide addition to the input information, and the input information thus obtained forms a part of the user interface that is partially made possible by the organic electronic tag.

In addition to the sensors, various feed back displays can be attached to the organic electronic tags 46. For example, the start and operation of an electronic tag can be displayed by the appropriate user feed back from the device arranged near the electronic tag 46 or near the electronic tag reader 20. For example, there can be arranged an LED state light near the electronic tag 46 and an LED state light near the electronic tag reader 20, which can offer intermittent or unintermittent, visually conspicuous light while the electronic tag is actively transmitting to the electronic tag reader 20. This provides the user with visual confirmation for the data transfer.

Optionally, there can be used the conventional passive or active matrix liquid crystal display devices generally used in portable computers and displays based on various electrooptical or micromechanical technology. Additionally, some particular devices can provide the users with visual feedback by means of nonimaging displays formed with the focused or distributed color changes of appropriate electrochromic materials.

The tag reader 20 (and the tag readers 26, 28) can be constituted so as to be able to detect the electromagnetic, optical and sound signals in a variety of frequencies. In a particular embodiment, the tag reader 20 can, needless to say, read the identification numbers and data of organic electronic tags, and can also write these. Specific digital services called in response to reading of a tag can also be made to depend on the device that has read the tag among the tag readers 20, 26, 28, the order when the organic electronic tag is read by one or more tag readers, the duration of presenting the organic electronic tag to a particular reader, or the other appropriate protocols for reading organic electronic tags that can be understood by the user.

After an electronic tag has been read, the computer system 12 is used to interpret the identification number of the organic electronic tag and to provide the digital service demanded. The semantic coupling of the identification number can be realized on the computer 14 (this may be a desktop computer, a processor devoted to electronic tag, or a portable pen computer), the data server 16 connected to the network, or the other accessible networked network server (computer) 18. The computers in the computer system 12 can mutually communicate by means of various wiring or wireless connections, and may support various communication protocols and designs. The various communication protocols and designs include the use of serial tethers (for example, the use of the RS-232C interface protocol), the use of infrared signals in conformity with the widely used IRDA communication standard, or the use of radio frequency signals (this may be a cellular phone system, 900 MHz wireless communication, or digital PCS telephone communication). Needless to say, there can be used the other communication standards or the other communication carrier waves such as based on optical or sound technology. The other communication destinations from the computer 12 include automated control systems, security authentication systems, wireless private digital aids, note computers, or other appropriately equipped electronic systems.

Coupling between the digital service and a particular electronic tag can be defined by the user, can be offered as default coupling by the system provider, can be repeated or memorized depending on the situation by the system, or may be any combinations thereof or other appropriate semantic coupling techniques. For example, a database format is constituted so that the individual identification numbers of electronic tags can be made to be the keys for the database.

To the keys are correlated the set of digital operations performed on detection of the electronic tag identification numbers. There exists a list citing such operations display of web pages, display of written documents, display of the date on a calendar, and displacement to a particular position within a document. Each operation is displayed with parameters according to the list of the pair (name, value) appropriate to the operation. For example, the operation of displaying a written document include the pair indicating the file to be displayed, the pair indicating whether display should be made with read only mode or not, or the pair indicating whether the file should be converted to a particular form or not. The user can easily add new tags and new operations to the originally offered list by using this general (name, value) mechanism and by making the database in the ASCII format readable by human beings. The database is compilable, and hence the relation between an electronic tag identification number and a digital service can be altered by the user at any time.

The organic electronic tags 32, 42, 44, 45, 46, 47 are attached to such objects as the document 30 and the polygon 50. The readable ranges of the electronic tags are arranged so as not to overlap with each other. The identification number specific to each organic electronic tag is presented to the tag readers 20, 26, 28 to be read thereby. The computer system 12 offers the digital service corresponding to the identification number that has been read. The computer system 12 includes a network printer that prints the document associated with the identification number. Preferably, a plurality of tags are read to offer the services corresponding to the plurality of identification numbers. Preferably, the electronic tags are provided with the shields that diminish the readable ranges on the organic electronic tags. These tags are characterized in that organic semiconductor elements are used for the tags.

INDUSTRIAL APPLICABILITY

As described above, the present invention can obtain an organic semiconductor element having a high mobility that can largely modify the drain current by the voltage applied to the gate because the organic semiconductor element is provided, in contact with an organic semiconductor layer, the element comprising an island-shaped protrusion layer on which island-shaped protrusions with a low surface energy are formed in a dispersed manner. Particularly, by providing the island-shaped protrusion layer, it is possible to control the crystalline state of the pentacene vapor-deposited layer and accordingly obtain the organic semiconductor element having a high mobility for low voltage driving.

Additionally, the production method of the present invention can form uniformly on a large area of substrate the island-shaped protrusion layer on which island-shaped protrusions with a low surface energy are dispersed, and accordingly can easily produce the above-described organic semiconductor element with a high mobility.

Additionally, the present invention can provide an active matrix type display device that utilizes the above-described organic semiconductor element with a high mobility, and an organic semiconductor device that utilizes the organic semiconductor element as the IC-card electronic tag.

The invention claimed is:

1. An organic semiconductor element comprising a gate electrode, a gate insulating layer, an organic semiconductor layer, source/drain electrodes and a protective film which are provided on a surface of a substrate, wherein the organic semiconductor element further comprises an island-shaped protrusion layer having dispersed and island-shaped protrusions with a low surface energy, wherein the island-shaped protrusion layer is formed by spin coating or spray coating, the organic semiconductor layer is formed after forming the island-shaped protrusion layer, and the organic semiconductor layer is in contact with the island-shaped protrusions, and wherein the island-shaped protrusions with the low surface energy are made of polyamide or polyimide.

2. An organic semiconductor element comprising a gate electrode, a gate insulating layer, an organic semiconductor layer, source/drain electrodes and a protective film which are provided on a surface of a substrate, wherein the organic semiconductor element further comprises an island-shaped protrusion layer having dispersed and island-shaped protrusions with a low surface energy, wherein the island-shaped protrusion layer is formed by spin coating or spray coating, the organic semiconductor layer is formed after forming the island-shaped protrusion layer, and the organic semiconductor layer is in contact with the island-shaped protrusions, and wherein the island-shaped protrusions with the low surface energy are made of a fluorine-based polymer selected from the group consisting of polyfumarate-based polymers and cyclic perfluoropolymers.

3. An organic semiconductor element comprising a gate electrode, a gate insulating layer, an organic semiconductor layer, source/drain electrodes and a protective film which are provided on a surface of a substrate, wherein the organic semiconductor element further comprises an island-shaped protrusion layer having dispersed and island-shaped protrusions with a low surface energy, wherein the island-shaped protrusion layer is formed by spin coating or spray coating, the organic semiconductor layer is formed after forming the island-shaped protrusion layer, and the organic semiconductor layer is in contact with the island-shaped protrusions, and wherein the island-shaped protrusions with the low surface energy are made of a fluorine-based compound selected from the group consisting of fluoroalkylsilane compounds and perfluoroether based compounds.

4. A production method of an organic semiconductor element, comprising providing on a surface of a substrate a gate electrode, a gate insulating layer, an organic semiconductor layer, source/drain electrodes and a protective film, wherein the method further comprises providing on the surface of the substrate an island-shaped protrusion layer having dispersed and island-shaped protrusions with a low surface energy, and wherein the island-shaped protrusions are formed in a dispersed manner by spin coating or spray coating, the organic semiconductor layer is formed after forming the island-shaped protrusion layer, and the organic semiconductor layer is formed in contact with the island-shaped protrusions.

5. The production method according to claim 4, wherein after forming the island-shaped protrusion layer having the dispersed and island-shaped protrusions with the low surface energy, which are formed by the spin coating or spray coating, the organic semiconductor layer is formed on the island-shaped protrusion layer under a heating condition of 60° C. to 200° C.

* * * * *

UNITED STATES PATENT AND TRADEMARK OFFICE
CERTIFICATE OF CORRECTION

| | | |
|---|---|---|
| PATENT NO. | : 7,202,495 B2 | |
| APPLICATION NO. | : 10/517529 | |
| DATED | : April 10, 2007 | |
| INVENTOR(S) | : Unno | |

It is certified that error appears in the above-identified patent and that said Letters Patent is hereby corrected as shown below:

COVER SHEET:
(56) Other Publications, After Bao: "TRansistors" should read -- Transistors --.

COLUMN 5:
Line 22, "an protective" should read -- a protective --.

COLUMN 6:
Line 35, "in an" should read -- in a --.

COLUMN 10:
Line 3, "limited" should read -- limited to --.

COLUMN 12:
Line 66, "TFT's" should read -- TFTs --.

COLUMN 14:
Line 12, "A: $\alpha$ -bromonaphtalene," should read -- A: $\alpha$ -bromonaphthalene, --.

COLUMN 19:
Line 28, "described" should read -- described in --.

UNITED STATES PATENT AND TRADEMARK OFFICE
CERTIFICATE OF CORRECTION

PATENT NO. : 7,202,495 B2
APPLICATION NO. : 10/517529
DATED : April 10, 2007
INVENTOR(S) : Unno It is certified that error appears in the above-identified patent and that said Letters Patent is hereby corrected as shown below:

COLUMN 20:
Line 17, "FIG 13." should read -- FIG. 13, --; and
Line 19, "film." should read -- film, --.

COLUMN 21:
Line 65, "in a" should read -- in an --.

Signed and Sealed this

Eleventh Day of March, 2008

JON W. DUDAS
*Director of the United States Patent and Trademark Office*